US011047795B2

(12) United States Patent
Negishi et al.

(10) Patent No.: US 11,047,795 B2
(45) Date of Patent: Jun. 29, 2021

(54) CALIBRATION CHUCKS FOR OPTICAL PROBE SYSTEMS, OPTICAL PROBE SYSTEMS INCLUDING THE CALIBRATION CHUCKS, AND METHODS OF UTILIZING THE OPTICAL PROBE SYSTEMS

(71) Applicant: FormFactor, Inc., Livermore, CA (US)

(72) Inventors: Kazuki Negishi, Hillsboro, OR (US); Michael E. Simmons, Colton, OR (US); Christopher Anthony Storm, Hillsboro, OR (US); Joseph George Frankel, Beaverton, OR (US); Eric Robert Christenson, Tualatin, OR (US); Mario René Berg, Dresden (DE)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 16/884,921

(22) Filed: May 27, 2020

(65) Prior Publication Data
US 2020/0378888 A1 Dec. 3, 2020

Related U.S. Application Data

(60) Provisional application No. 62/856,413, filed on Jun. 3, 2019.

(51) Int. Cl.
*G01N 21/27* (2006.01)
*G01B 11/02* (2006.01)
(Continued)

(52) U.S. Cl.
CPC ......... *G01N 21/274* (2013.01); *G01B 11/026* (2013.01); *G01B 11/14* (2013.01);
(Continued)

(58) Field of Classification Search
CPC .. G01R 35/005; G01R 35/007; G01R 31/265; G01R 31/2656; G01R 31/27;
(Continued)

(56) References Cited

U.S. PATENT DOCUMENTS 5,237,267 A * 8/1993 Harwood ........... G01R 1/06705
324/750.2
6,420,892 B1 7/2002 Krivy et al.
(Continued)

*Primary Examiner* — Gordon J Stock, Jr.
(74) *Attorney, Agent, or Firm* — Dascenzo Gates Intellectual Property Law, P.C.

(57) ABSTRACT

Calibration chucks for optical probe systems, optical probe systems including the calibration chucks, and methods of utilizing the optical probe systems. The calibration chucks include a calibration chuck body that defines a calibration chuck support surface. The calibration chucks also include at least one optical calibration structure that is supported by the calibration chuck body. The at least one optical calibration structure includes a horizontal viewing structure. The horizontal viewing structure is configured to facilitate viewing of a horizontally viewed region from a horizontal viewing direction that is at least substantially parallel to the calibration chuck support surface. The horizontal viewing structure also is configured to facilitate viewing of the horizontally viewed region via an imaging device of the optical probe system that is positioned vertically above the calibration chuck support surface.

34 Claims, 11 Drawing Sheets

(51) Int. Cl.
*G01R 31/28* (2006.01)
*G01R 31/308* (2006.01)
*G01R 35/00* (2006.01)
*G01B 11/14* (2006.01)
*H01L 21/66* (2006.01)
*G01B 21/04* (2006.01)

(52) U.S. Cl.
CPC ....... *G01B 21/042* (2013.01); *G01R 31/2865* (2013.01); *G01R 31/308* (2013.01); *G01R 35/005* (2013.01); *H01L 22/12* (2013.01); *H01L 22/30* (2013.01)

(58) Field of Classification Search
CPC .............. G01R 31/275; G01R 31/2806; G01R 31/2808; G01R 31/2865; G01R 31/2868; G01R 31/2874; G01R 31/2886; G01R 31/2887; G01R 31/302; G01R 31/303; G01R 31/304; G01R 31/308; G01R 31/309; G01R 31/311; G01R 31/31728; G01B 11/026; G01B 11/14; G01B 11/2504; G01N 21/042; G01N 21/274; G01N 21/8803; G01N 21/8806; G01N 21/83; G01N 21/9501; G01N 21/9506; G01M 11/08; G01M 11/081; G01M 11/083; G01M 11/085; G01M 11/30; G01M 11/31; G01M 11/35; H01L 22/10; H01L 22/12; H01L 22/30; G01D 11/30; G02B 6/3586
USPC .............. 356/614–624; 324/750.02, 750.16, 324/750.23, 754.01, 754.03, 754, 6, 324/754.07, 754.21, 754.23
See application file for complete search history.

(56) References Cited

U.S. PATENT DOCUMENTS

| | | | | |
|---|---|---|---|---|
| 6,464,126 | B2 * | 10/2002 | Hayata | B23K 20/004 228/1.1 |
| 6,467,673 | B2 * | 10/2002 | Enokido | B23K 20/004 228/1.1 |
| 6,762,848 | B2 * | 7/2004 | Hayata | B23K 20/004 228/105 |
| 6,925,238 | B2 * | 8/2005 | Lee | G01M 11/35 385/123 |
| 7,538,564 | B2 * | 5/2009 | Ehrmann | G01R 31/2891 324/754.03 |
| 7,788,818 | B1 * | 9/2010 | Tran | G01B 3/30 33/502 |
| 7,999,563 | B2 * | 8/2011 | Rumiantsev | G01R 31/2886 324/750.03 |
| 10,175,266 | B1 * | 1/2019 | Siddiqui | G01R 31/2656 |
| 10,180,486 | B2 * | 1/2019 | Bock | G01R 1/067 |
| 10,459,006 | B2 * | 10/2019 | Fisher | G01R 31/2891 |
| 10,809,048 | B2 * | 10/2020 | Negishi | G01B 21/042 |
| 10,809,104 | B2 * | 10/2020 | Jenisch | G01D 11/30 |
| 2006/0212248 | A1 | 9/2006 | Kiesewetter et al. | |
| 2007/0096763 | A1 | 5/2007 | Ehrmann et al. | |
| 2012/0255794 | A1 | 10/2012 | Fenske et al. | |
| 2018/0088149 | A1 | 3/2018 | Fisher et al. | |
| 2018/0294175 | A1 | 10/2018 | Ahamed et al. | |

* cited by examiner

CALIBRATION CHUCKS FOR OPTICAL PROBE SYSTEMS, OPTICAL PROBE SYSTEMS INCLUDING THE CALIBRATION CHUCKS, AND METHODS OF UTILIZING THE OPTICAL PROBE SYSTEMS

RELATED APPLICATION

This application claims priority to U.S. Provisional Patent Application No. 62/856,413, which was filed on Jun. 3, 2019, and the complete disclosure of which is hereby incorporated by reference.

FIELD OF THE DISCLOSURE

The present disclosure relates generally to calibration chucks for optical probe systems, to optical probe systems including the calibration chucks, and to methods of utilizing the optical probe systems.

BACKGROUND OF THE DISCLOSURE

Optical probe systems may be utilized to probe, to optically probe, to test, and/or to optically test the functionality, operation, and/or performance of an optical device. This may include directing one or more optical test signals incident upon the optical device and/or receiving one or more optical resultant signals from the optical device.

In general, it may be desirable to calibrate an optical probe system prior to, during, and/or after testing of an optical device with the optical probe system. Thus, there exists a need for improved calibration chucks for optical probe systems, optical probe systems that include the calibration chucks, and/or methods of utilizing the optical probe systems.

SUMMARY OF THE DISCLOSURE

Calibration chucks for optical probe systems, optical probe systems including the calibration chucks, and methods of utilizing the optical probe systems. The calibration chucks include a calibration chuck body that may define a calibration chuck support surface. The calibration chucks also include at least one optical calibration structure that may be supported by the calibration chuck body. The at least one optical calibration structure may include a horizontal viewing structure. The horizontal viewing structure may be configured to facilitate viewing of a horizontally viewed region from a horizontal viewing direction that is at least substantially parallel to the calibration chuck support surface. The horizontal viewing structure also may be configured to facilitate viewing of the horizontally viewed region via an imaging device of the optical probe system, with such imaging device positioned vertically above the calibration chuck support surface.

The optical probe systems include a device substrate chuck, an optical probe assembly, a signal generation and analysis assembly, an imaging device, and the calibration chuck. The device substrate chuck may define a device substrate support surface that may be configured to support a device substrate that includes a plurality of optical devices. The optical probe assembly may include at least one optical probe. The signal generation and analysis assembly may be configured to provide an optical test signal to the at least one optical probe and/or to receive an optical resultant signal from the at least one optical probe. The imaging device may be positioned vertically above the device substrate chuck and the calibration chuck.

The methods include aligning at least one optical probe and collecting data utilizing the at least one probe. The aligning may include aligning the at least one optical probe with the at least one optical calibration structure of the calibration chuck. The collecting data may include collecting the data utilizing the at least one optical probe and utilizing the at least one optical calibration structure.

DETAILED DESCRIPTION AND BEST MODE OF THE DISCLOSURE

Figure 1:
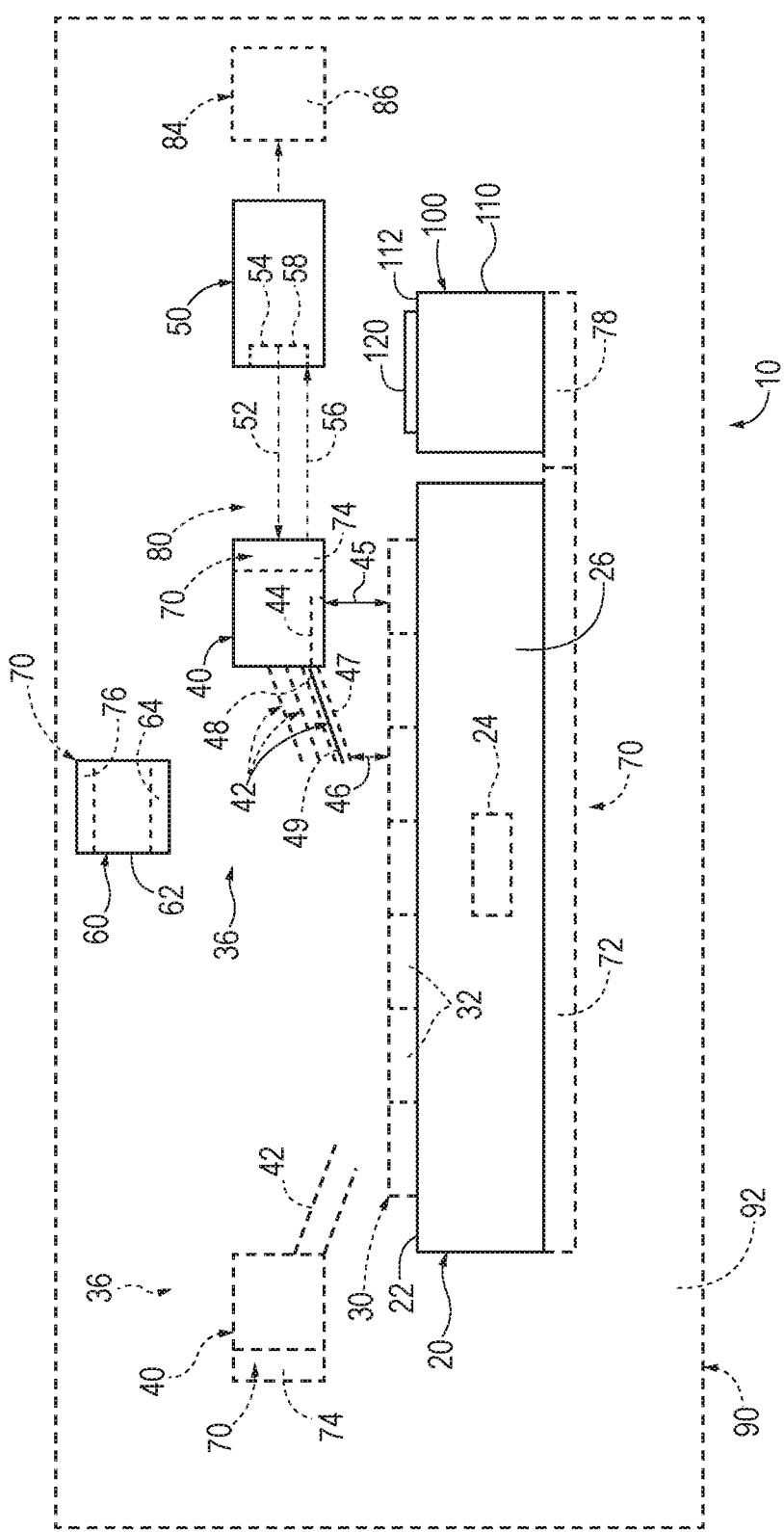
FIG. 1 is a schematic illustration of examples of an optical probe system that may include and/or utilize a calibration chuck, according to the present disclosure.

FIGS. 1-13 provide examples of calibration chucks 100, of optical probe systems 10 that include the calibration chucks, and/or of methods of utilizing the optical probe systems, according to the present disclosure. Elements that serve a similar, or at least substantially similar, purpose are labeled with like numbers in each of FIGS. 1-13, and these elements may not be discussed in detail herein with reference to each of FIGS. 1-13. Similarly, all elements may not be labeled in each of FIGS. 1-13, but reference numerals associated therewith may be utilized herein for consistency. Elements, components, and/or features that are discussed herein with reference to one or more of FIGS. 1-13 may be included in and/or utilized with any of FIGS. 1-13 without departing from the scope of the present disclosure.

In general, elements that are likely to be included in a particular embodiment are illustrated in solid lines, while elements that are optional are illustrated in dashed lines. However, elements that are shown in solid lines may not be essential and, in some embodiments, may be omitted without departing from the scope of the present disclosure.

FIG. 1 is a schematic illustration of examples of an optical probe system 10 that may include and/or utilize a calibration chuck 100, according to the present disclosure. Optical probe system 10 also may be referred to herein as a probe system 10 and/or as a system 10. Optical probe system 10 includes a device substrate chuck 20 that defines a device substrate support surface 22. Device substrate support surface 22 is configured to support a device substrate 30 that may include a plurality of optical devices 32.

Optical probe system 10 also includes an optical probe assembly 40. Optical probe assembly 40 includes at least one optical probe 42. In some examples, and as illustrated in dashed lines in FIG. 1, optical probe system 10 may include a plurality of optical probe assemblies 40 and/or a given optical probe assembly 40 may include a plurality of optical probes 42.

As illustrated in dashed lines in FIG. 1, optical probe assembly 40 may form a portion of a probe assembly 36 that also includes at least one electrical probe 38. Electrical probes 38, when present, may be configured to provide an electrical test signal to optical devices 32 and/or to receive an electrical resultant signal from the optical devices.

Optical probe system 10 further includes a signal generation and analysis assembly 50. Signal generation and analysis assembly 50 is configured to provide an optical test signal 52 to at least one optical probe assembly 40 and/or at least one optical probe 42 thereof, and/or to receive an optical resultant signal 56 from at least one optical probe assembly 40 and/or at least one optical probe 42 thereof. Additionally or alternatively, signal generation and analysis assembly 50 may be configured to provide the electrical test signal to the at least one electrical probe and/or to receive the electrical resultant signal from the at least one electrical probe.

Thus, optical probe system 10 may be configured to perform any suitable optical and/or electrical test of optical devices 32. As examples, the tests may include tests that provide an electrical test signal to the optical devices and receive a corresponding optical resultant signal from the optical devices, tests that provide an optical test signal to the optical devices and receive a corresponding electrical resultant signal from the optical devices, tests that provide an optical test signal to the optical devices and receive a corresponding optical resultant signal from the optical devices, and/or tests that provide an electrical test signal to the optical devices and receive an electrical resultant signal from the optical devices.

Optical probe system 10 also includes a calibration chuck 100 and an imaging device 60. Imaging device 60 may be positioned vertically above device substrate chuck 20 and/or calibration chuck 100. Imaging device 60 may be configured to collect one or more optical images of the calibration chuck, of the device substrate chuck, and/or of a region that extends between the imaging device and the calibration chuck and/or the device substrate chuck. This may include collection of optical images in a top-down, bottom-up, and/or horizontal viewing configuration while maintaining a fixed relative orientation among the various imaged components of the optical probe system.

Device substrate chuck 20 may include any suitable structure that may define device substrate support surface 22 and/or that may support device substrate 30. As an example, device substrate chuck 20 may include a chuck body 26 that may form and/or define the device substrate support surface.

In some examples, device substrate chuck 20 may include a thermal control unit 24. Thermal control unit 24 may be configured to control and/or regulate a temperature of device substrate support surface 22 and/or of device substrate 30 when the device substrate is supported by the device substrate support surface. Examples of thermal control unit 24 include a heating assembly, a cooling assembly, and/or a heat transfer assembly configured to exchange thermal energy with a temperature-controlled fluid stream. When device substrate chuck 20 includes thermal control unit 24, the device substrate chuck also may be referred to herein as a thermal chuck 20 and/or as a temperature-controlled chuck 20.

Optical probe system 10 may be configured to permit and/or facilitate operative translation and/or rotation of device substrate chuck 20 relative to one or more other components of the optical probe system. This may be accomplished in any suitable manner. As an example, optical probe system 10 may include a translation structure 70, such as in the form of a device substrate chuck translation structure 72. Device substrate chuck translation structure 72 may be configured to operatively translate and/or rotate device substrate chuck 20 relative to optical probe assembly 40 and/or relative to imaging device 60. Examples of translation structure 70 and/or of device substrate chuck translation structure 72 include an actuator, an electric actuator, a stepper motor, a piezoelectric actuator, a rack and pinion assembly, a ball screw and nut assembly, a linear actuator, a linear motor, and/or a rotary actuator.

In some examples, calibration chuck 100 may be operatively attached to device substrate chuck 20 and/or may be configured to move with the device substrate chuck. This may include direct attachment to the device substrate chuck and/or indirect attachment to the device substrate chuck, such as via device substrate chuck translation structure 72. In other examples, probe system 10 may include another, or a separate, translation structure 70 in the form of a calibration chuck translation structure 78. Calibration chuck translation structure 78, when present, may be configured to operatively translate and/or rotate calibration chuck 100 relative to device substrate chuck 20, relative to optical assembly 40, and/or relative to imaging device 60.

Translation structures 70 may include and/or be any suitable structure and/or actuator. As examples, translation structures 70 may include a linear actuator, a rotary actuator, a rack and pinion assembly, a lead screw and nut assembly, a mechanical actuator, an electrical actuator, a stepper motor, and/or a piezoelectric actuator.

Device substrate 30 may include and/or be any suitable structure that may support and/or include any suitable number of optical devices 32. Examples of device substrate 30 include a semiconductor wafer, a silicon wafer, a Group III-V semiconductor wafer, and/or a gallium arsenide wafer. Examples of optical devices 32 include a plurality of silicon photonics optical devices.

Optical probe assembly 40 may include any suitable structure that may include, support, and/or define at least one optical probe 42. As discussed, optical probe assembly 40 may include, support, and/or define a plurality of optical probes 42. An example of optical probes 42 includes a fiber optic probe that may include and/or may be defined by a probe fiber 48. In such an example, optical probes 42 also may include a sheath and/or a housing 47 that may surround at least a portion of the probe fiber.

In some examples, optical probe assemblies 40 may include a distance sensor 44. Distance sensor 44, when present, may be configured to detect, to determine, to estimate, and/or to calculate a distance 46 between optical probe 42 and device substrate 30. Examples of distance sensor 44 include a capacitive distance sensor, a capacitive displacement sensor, an eddy current displacement sensor, a laser triangulation sensor, a confocal sensor, and/or a spectral interference displacement sensor.

Optical probe system 10 may be configured to permit and/or facilitate operative translation and/or rotation of optical probe assembly 40 and/or optical probe 42 thereof relative to one or more other components of the optical probe system. This may be accomplished in any suitable manner. As an example, optical probe system 10 may include a translation structure 70, such as in the form of an optical probe assembly translation structure 74. Optical probe assembly translation structure 74 may be configured to operatively translate and/or rotate optical probe assembly 40 and/or optical probe 42 relative to device substrate chuck 20, relative to imaging device 60, and/or relative to calibration chuck 100. Examples of translation structure 70 and/or of optical probe assembly translation structure 74 are disclosed herein.

Signal generation and analysis assembly 50 may include any suitable structure that may provide optical test signal 52 and/or that may receive optical resultant signal 56. As an example, signal generation and analysis assembly 50 may include a light source 54, which may be configured to generate optical test signal 52. Examples of the light source include a laser light source and/or a laser. As another example, signal generation and analysis assembly 50 may include a light detector 58, which may be configured to receive and/or to detect optical resultant signal 56. Examples of light detector 58 include an optical power meter, a photo detector, and/or a photo diode. In some examples, probe system 10 may include a fiber optic cable 80, which may be configured to convey optical test signal 52 and/or optical resultant signal 56 between the signal generation and analysis assembly and the optical probe assembly. In other examples, one or more components of the signal generation and analysis assembly, such as light source 54 and/or light detector 58, may be integrated into, integral with, and/or operatively attached to optical probe assembly 40.

Imaging device 60 may include any suitable structure that may be positioned vertically above device substrate chuck 20, that may be positioned vertically above calibration chuck 100, and/or that may be configured to collect the one or more optical images. As an example, imaging device 60 may include and/or be a microscope 60, which may include an objective lens 64. As another example, imaging device 60 may be configured to receive an optical image, or light, and to generate an electronic representation of the optical image 86, such as may be accomplished with, via, and/or utilizing a camera of the imaging device, examples of which include a CCD image sensor and/or a CMOS image sensor. In some examples, optical probe system 10 may include a display 84, which may be configured to display the electronic representation of the optical image.

Optical probe system 10 may be configured to permit and/or facilitate operative translation and/or rotation of imaging device 60 thereof relative to one or more other components of the optical probe system. This may be accomplished in any suitable manner. As an example, optical probe system 10 may include a translation structure 70, such as in the form of an imaging device translation structure 76. Imaging device translation structure 76 may be configured to operatively translate and/or rotate imaging device 60 relative to device substrate chuck 20, relative to calibration chuck 100, and/or relative to optical probe assembly 40. Examples of translation structure 70 and/or of imaging device translation structure 76 are disclosed herein.

In some examples, optical probe system 10 may include an enclosure 90 that may define an enclosed volume 92. Enclosure 90, when present, may be configured to contain and/or house one or more other components of optical probe system 10, such as to shield, optically shield, electromagnetically shield, magnetically shield, thermally shield, and/or electrically shield the one or more other components of the optical probe system. Additionally or alternatively, a purge gas, such as a clean dry air purge, may be provided to enclosed volume 92 to maintain a low dew point, or a dry, environment within the enclosed volume and/or to maintain a target moisture, or humidity, level within the enclosed volume. As an example, at least device substrate support surface 22 of device substrate chuck 20 may be positioned within the enclosed volume, such as to shield device substrate 30, which may be positioned on the device substrate support surface.

Calibration chuck 100 includes a calibration chuck body 110 that may form and/or define a calibration chuck support surface 112. Calibration chuck 100 also includes at least one optical calibration structure 120, which may be supported by the calibration chuck body. Calibration chuck 100 may be positioned, relative to device substrate chuck 20, such that calibration chuck support surface 112 may be parallel to, or at least substantially parallel to, device substrate support surface 22. In a specific example, calibration chuck support surface 112 may be parallel to device substrate support surface 22 and may be vertically below the device substrate support surface.

Figure 2:
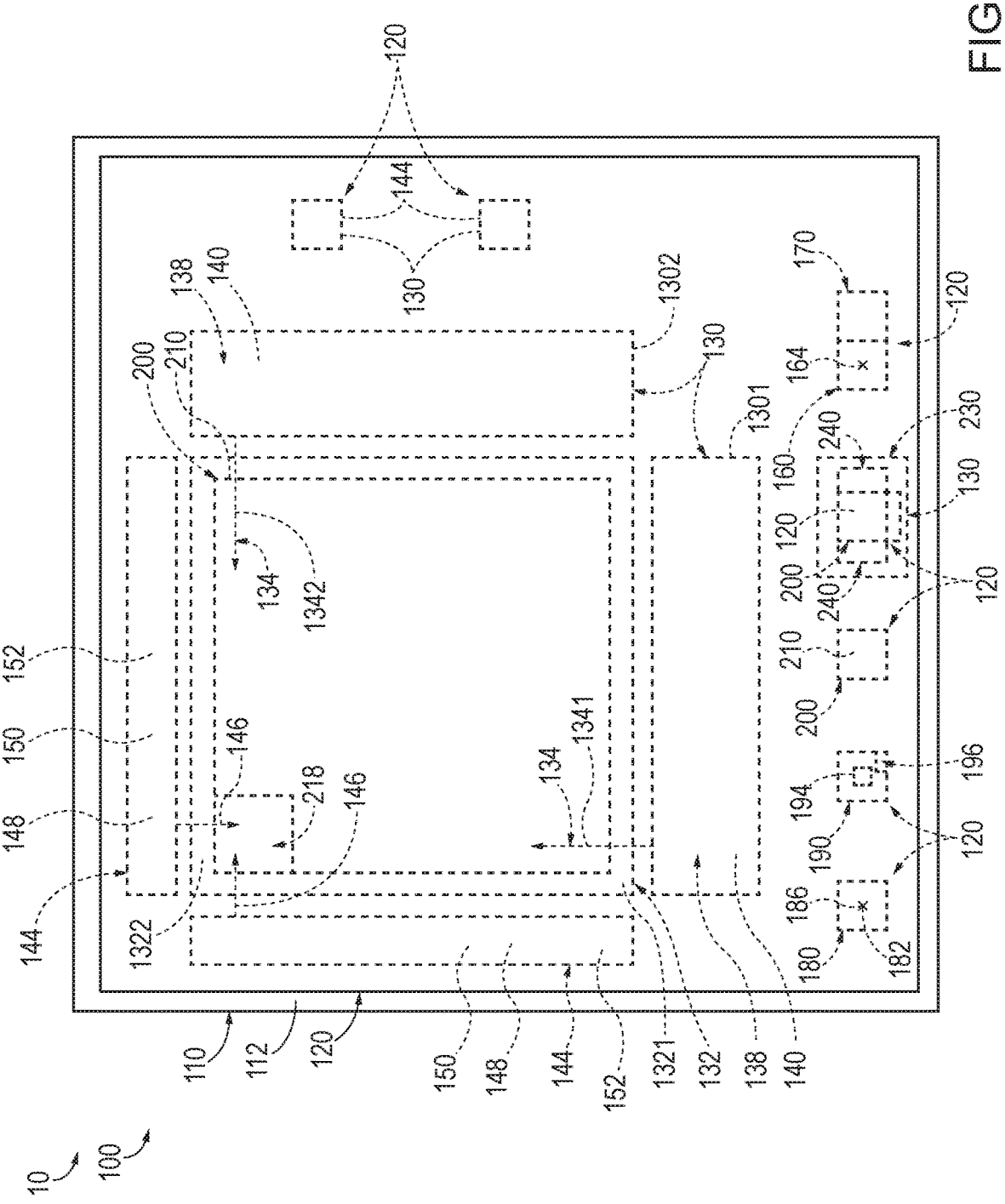
FIG. 2 is a schematic illustration of examples of a calibration chuck according to the present disclosure.
Figure 3:
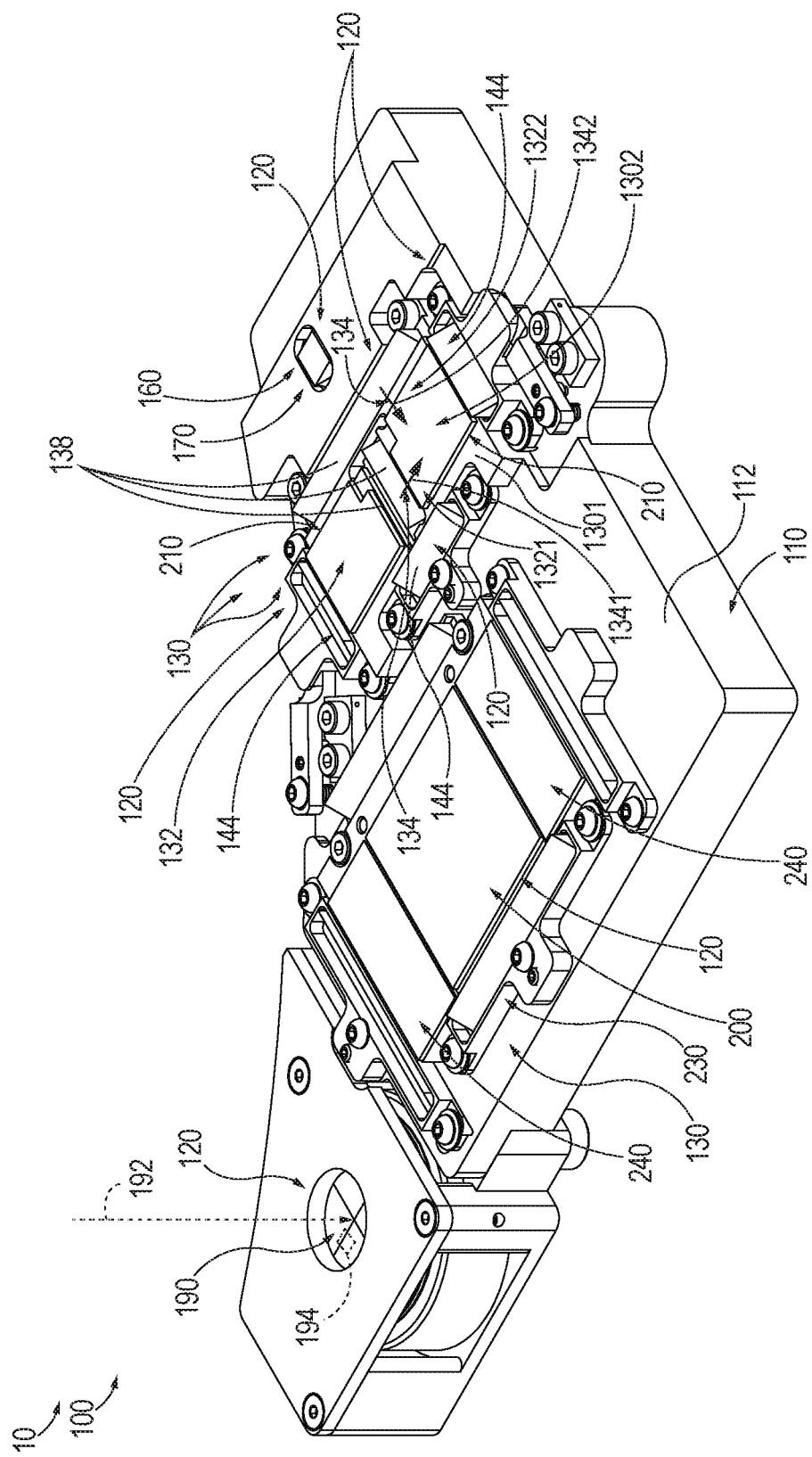
FIG. 3 is a less schematic profile view of examples of a calibration chuck according to the present disclosure.
Figure 4:
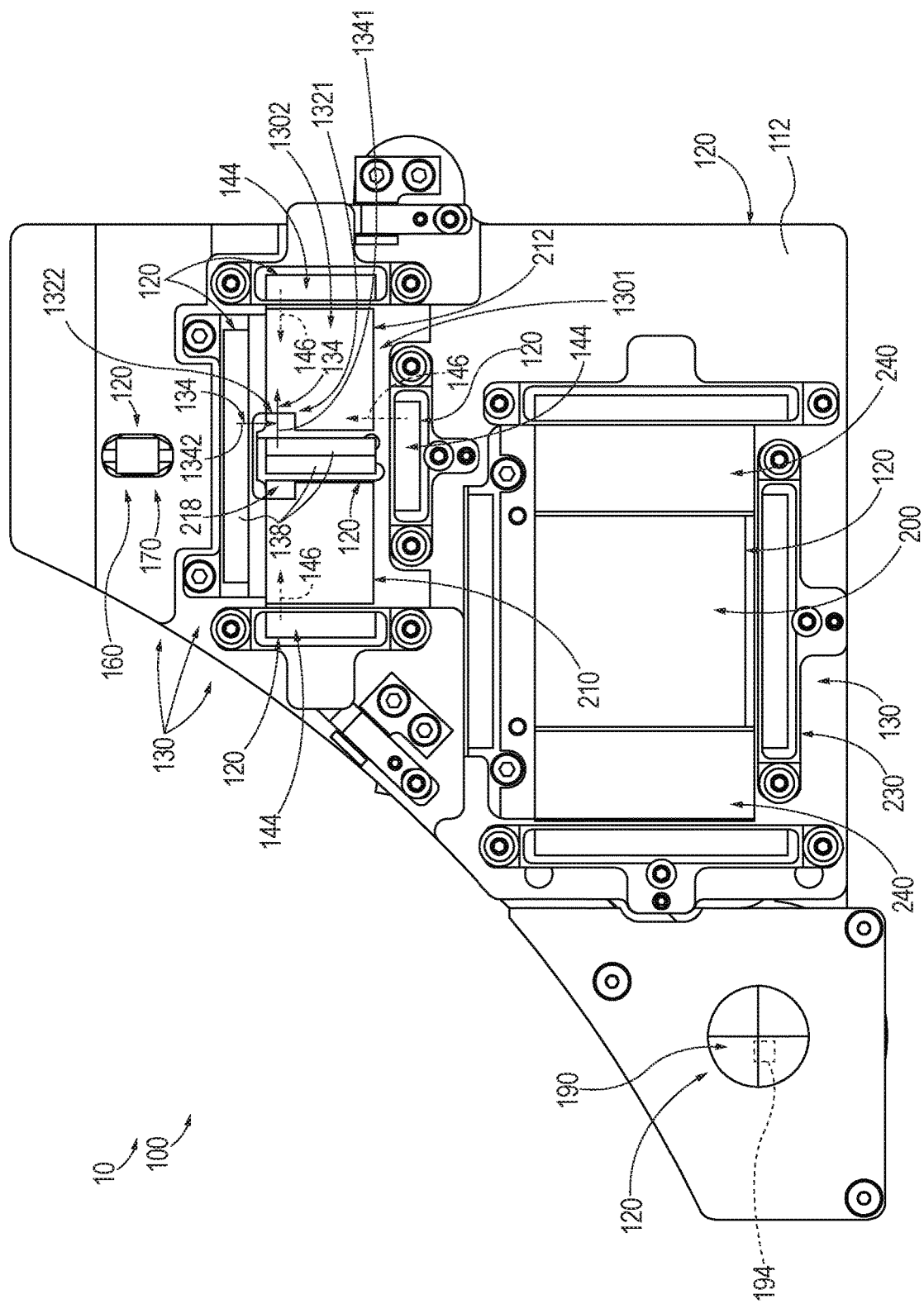
FIG. 4 is a top view of the calibration chuck of FIG. 3.
Figure 5:
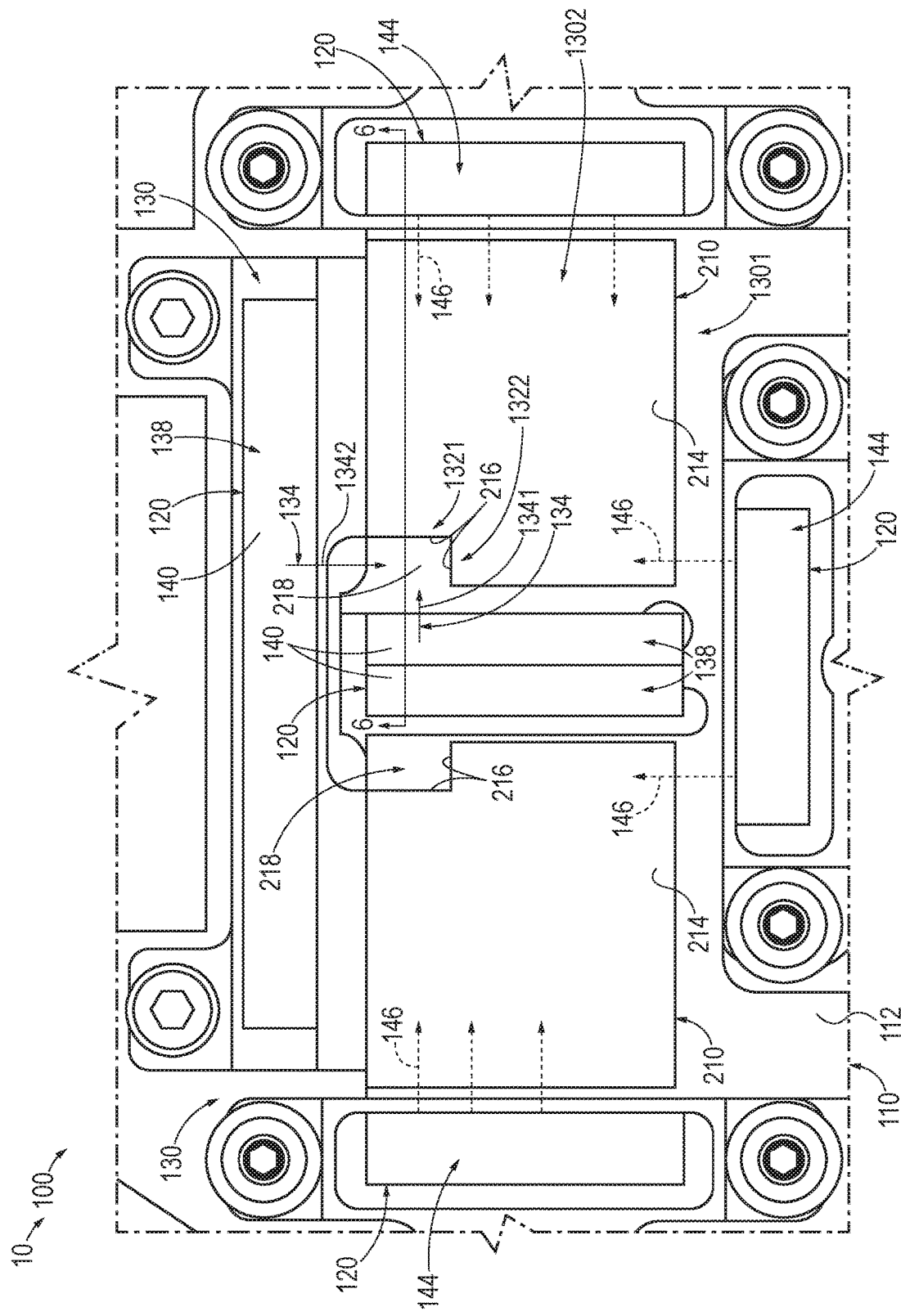
FIG. 5 is a top view illustrating a portion of the calibration chuck of FIGS. 3-4.
Figure 6:
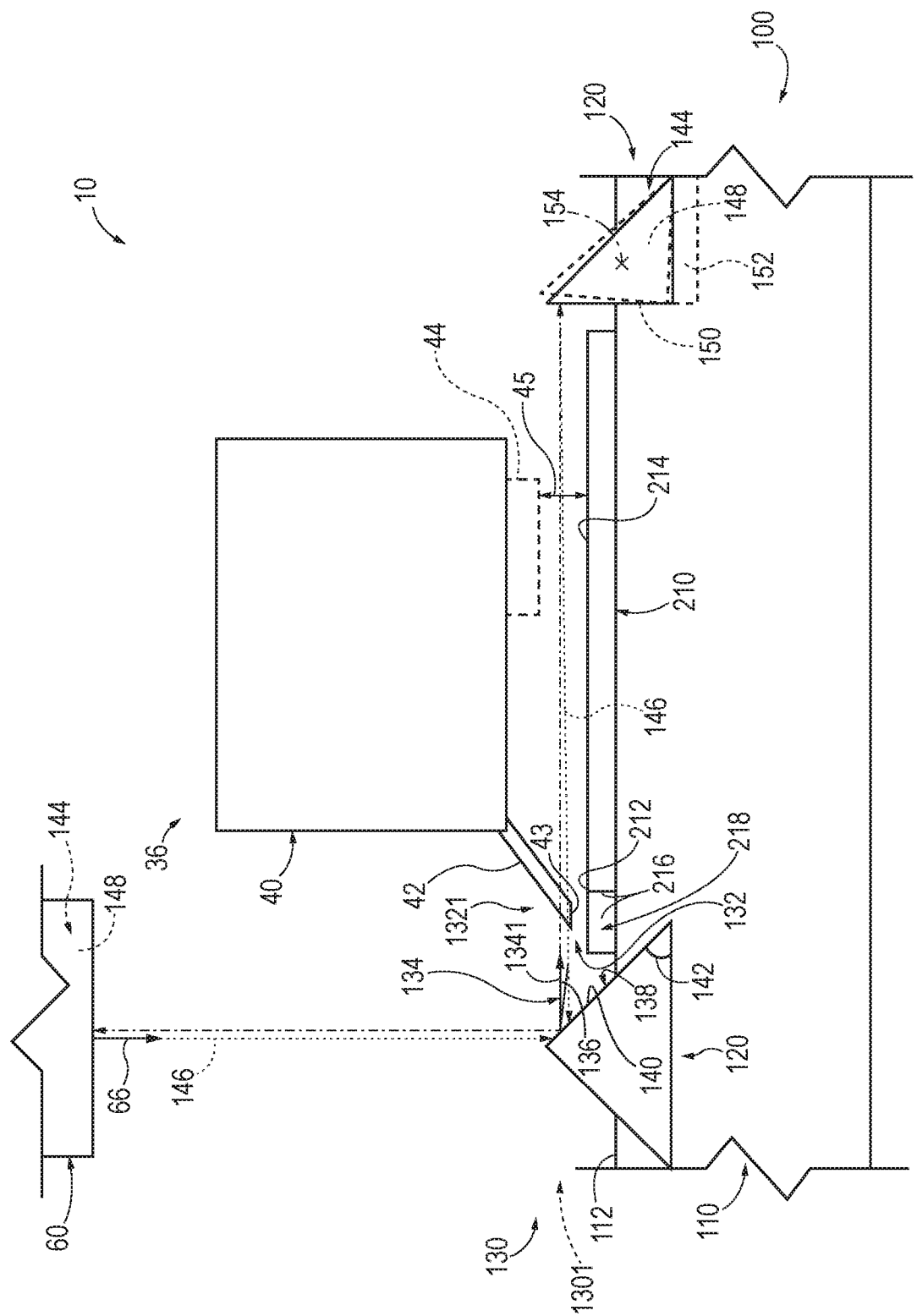
FIG. 6 is a schematic side view of a portion of the calibration chuck of FIGS. 3-5.
Figure 7:
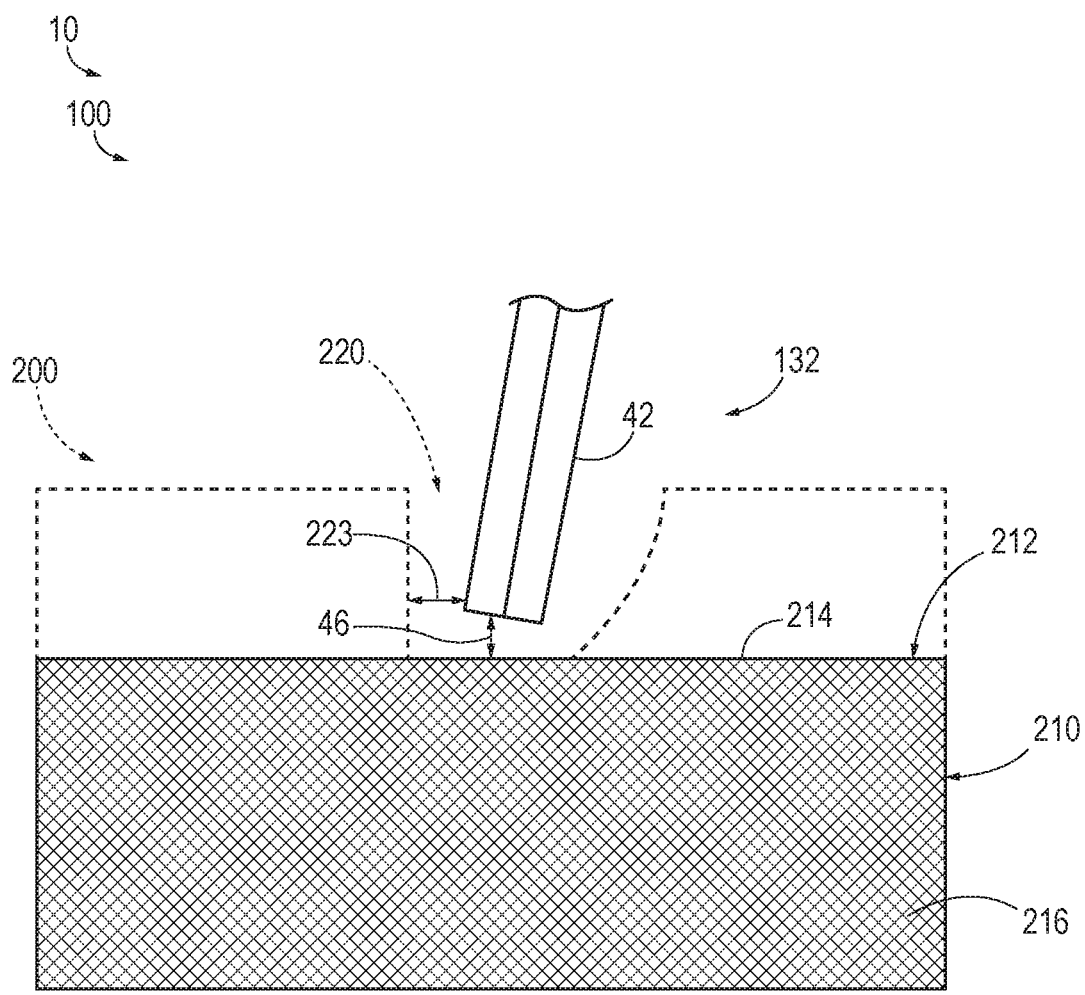
FIG. 7 is an illustration of examples of an image that may be collected utilizing a horizontal viewing structure of a calibration chuck, according to the present disclosure.
Figure 12:
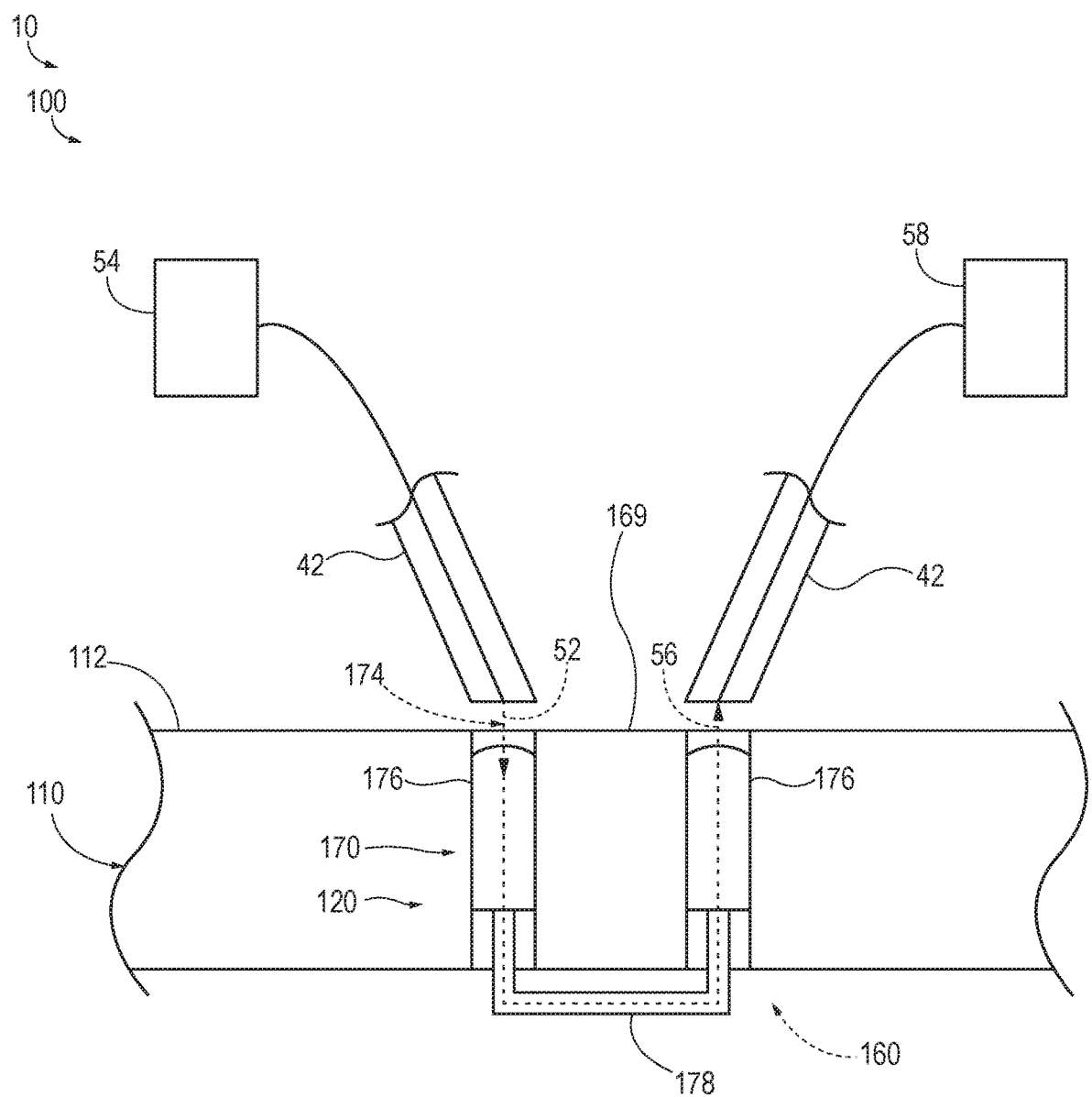
FIG. 12 is another illustration of an example of a test that may be performed utilizing a vertical viewing structure, according to the present disclosure.
Figure 13:
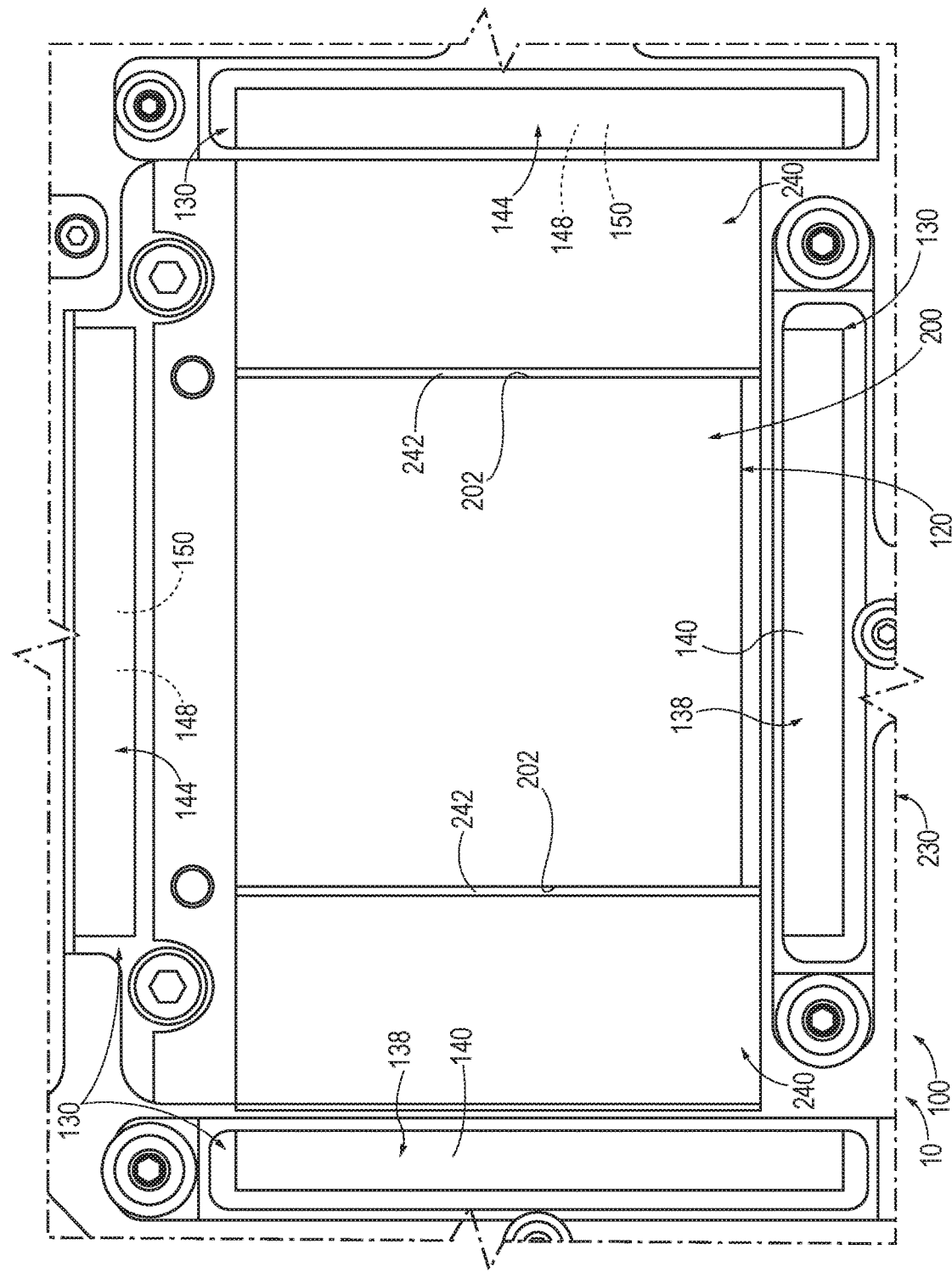
FIG. 13 is a top view illustrating a portion of the calibration chuck of FIGS. 3-4.

FIG. 1 schematically illustrates calibration chuck 100 in the context of, or included within, optical probe system 10, while FIG. 2 is a more detailed, but still schematic, illustration of examples of a calibration chuck 100 according to the present disclosure. FIGS. 3-4 are less schematic views of examples of a calibration chuck 100 according to the present disclosure, while FIGS. 5-6 and 13 are less schematic views of portions and/or regions of the calibration chuck of FIGS. 3-4. FIG. 7 illustrates an example of an image that may be collected utilizing calibration chucks 100, and FIGS. 8-12 provide examples of tests that may be performed utilizing calibration chucks 100.

It is within the scope of the present disclosure that any structure, function, and/or feature of optical probe systems 10 and/or calibration chucks 100 illustrated and/or discussed herein with reference to any one of FIGS. 1-13 may be included in and/or utilized with any other of FIGS. 1-13 without departing from the scope of the present disclosure. Stated another way, FIGS. 2-13 may be more detailed illustrations of calibration chuck 100 of FIG. 1. As discussed, calibration chuck 100 includes calibration chuck body 110, calibration chuck support surface 112, and optical calibration structure 120.

Optical calibration structure 120 may include any suitable structure that may, or that may be utilized to, perform any suitable calibration and/or quantification of and/or within optical probe system 10. As an example, optical calibration structure 120 may include and/or be a horizontal viewing structure 130. Horizontal viewing structure 130 may be configured to facilitate viewing of a horizontally viewed region 132 from a horizontal viewing direction 134 that may be parallel, or at least substantially parallel, to calibration chuck support surface 112. This may include viewing of the horizontally viewed region from the horizontal viewing direction and with, via, and/or utilizing an imaging device, such as imaging device 60 of FIG. 1, that may be positioned vertically above calibration chuck support surface 112.

Horizontally viewed region 132 may include any suitable region and/or structure. As an example, horizontally viewed region 132 may include an optical probe, such as optical probe 42 of FIG. 1, of an optical probe system, such as optical probe system 10 of FIG. 1. As another example, the horizontally viewed region may include a calibration substrate edge 212 of a calibration substrate 210, as perhaps best illustrated in FIGS. 6-7.

FIG. 6 is a schematic illustration of examples of a side view of a portion of an optical probe system 10 including a calibration chuck 100 with an optical calibration structure 120 in the form of a horizontal viewing structure 130, while FIG. 7 is an illustration of examples of an image that may be collected utilizing a horizontal viewing structure of a calibration chuck. FIG. 6 additionally or alternatively may be referred to herein as and/or may be a schematic cross-sectional view of optical probe system 10 taken along line 6-6 of FIG. 5.

As illustrated in FIGS. 6-7, and during operation of probe system 10, an optical probe 42 may be aligned near and/or proximate a calibration substrate edge 212 of a calibration substrate 210. The calibration substrate edge may include and/or be a transition, or a transition region, between a horizontal calibration substrate surface 214 of calibration substrate 210 and a vertical calibration substrate surface 216 of the calibration substrate. As illustrated in FIG. 6, an imaging device 60, which may be positioned vertically above a calibration chuck support surface 112 of the calibration chuck, then may be utilized to collect an image, such as the image that is illustrated in FIG. 7, of optical probe 42 and/or of calibration substrate edge 212 along and/or from a horizontal viewing direction 134. Stated another way, the imaging device may be utilized to collect an image of a horizontally viewed region 132 of probe system 10.

As illustrated, probe system 10 and/or calibration chuck 100 may utilize horizontal viewing structure 130 to permit imaging device 60, which faces in a viewing direction 66 that differs from, may be perpendicular to, and/or may be at least substantially perpendicular to horizontal viewing direction 134, to view horizontally viewed region 132 from horizontal viewing direction 134. This may be accomplished utilizing any suitable structure, examples of which are disclosed herein.

Horizontal viewing direction 134 may be parallel, or at least substantially parallel, to horizontal calibration substrate surface 214. As such, the image collected by the configuration of FIG. 6, and illustrated in FIG. 7, may provide a sharp and/or clear transition between calibration substrate edge 212 and optical probe 42, thereby permitting and/or facilitating accurate observation, calculation, and/or calibration of a distance 46 between the optical probe and a surface that is below the optical probe, such as a surface of device substrate 30 in the example that is illustrated in FIG. 1 and/or horizontal calibration substrate surface 214 of the calibration substrate in the example that is illustrated in FIGS. 6-7.

In some examples, and as illustrated in dashed lines in FIGS. 1 and 6, an optical probe assembly 40 that includes optical probe 42 also may include a distance sensor 44. In these examples, distance sensor 44 also may be utilized to determine, calculate, and/or measure a distance 45 between the distance sensor and the device substrate and/or the calibration substrate. In such a configuration, distance 45 may be compared to, correlated to, and/or calibrated via distance 46 as determined via the image collected by imaging device 60, such as to permit and/or facilitate accurate subsequent determination of distance 46 utilizing measurements of distance 45 that may be generated by distance sensor 44.

In some examples, it may be desirable to rotate optical probe 42 relative to calibration substrate 210 while maintaining a constant, or an at least substantially constant, distance 46 between the optical probe and the calibration substrate. Such rotation, for example, may be performed utilizing one or more of translation structures 70, which are discussed in more detail herein.

In these examples, rotation of the optical probe may cause distance 45 between the distance sensor and the calibration substrate to vary. Utilizing imaging device 60 and horizontal viewing structure 130, a correlation may be established between the angle of the optical probe relative to the calibration substrate, distance 46, distance 45, and/or a signal that is generated by distance sensor 44. Such correlation then may be utilized, during testing of optical devices that may be present on a device substrate, to accurately maintain and/or predict the distance between the optical probe and the device substrate based upon the signal generated by the distance sensor and the angle of the probe relative to the calibration substrate.

With continued reference to FIG. 6, optical probe 42 may be rotated to permit and/or facilitate alignment of an underside 43 of the optical probe with calibration substrate 210 and/or with an optical device. As an example, a plane of underside 43 may be aligned with an upper surface of calibration substrate 210 and/or of the optical device. With this in mind, horizontal viewing structure 130 may be utilized to view underside 43 and the upper surface of the calibration substrate and/or of the optical device, such as to permit and/or facilitate this alignment.

In some examples, horizontal calibration substrate surface 214 of calibration substrate 210 may be planar, or at least substantially planar. In other examples, and as illustrated in FIG. 7, calibration substrate 210 may include a trench 220 and/or may include and/or be an optical device 200 that includes trench 220. In such a configuration, horizontal viewing structure 130 may be utilized to position and/or align optical probe 42 within the trench. Such a configuration may permit and/or facilitate optical testing of optical device 200 within trench 220.

In some examples, optical probe 42 may couple with optical device 200 via a bottom surface of trench 220. In such examples, horizontal viewing structure 130 may be utilized to detect and/or to quantify distance 46, which also may be referred to herein as a vertical distance 46, between the optical probe and the optical device.

In some examples, optical probe 42 may couple with optical device 200 via edge coupling between the optical probe and a vertical surface of the optical device within the trench. In such examples, horizontal viewing structure 130 may be utilized to detect and/or to quantify a distance 223, which also may be referred to herein as a horizontal distance 223, between the optical probe and the optical device. In some examples, the optical device may be at and/or near an upper region of the vertical surface. As an example, trench 220 may be 100 micrometers deep but the optical device may be within, or the optical probe may couple to the optical device within, 10 micrometers or less of the upper surface of the optical device.

Returning to FIG. 1, and as discussed, thermal control unit 24 may be utilized to control and/or regulate the temperature of device substrate support surface 22 and/or of device substrate 30. This may include temperature regulation over a temperature range of several hundred degrees Celsius (°

C.). As examples, the temperature may be regulated to permit optical probe system 10 to perform a plurality of tests at a plurality of different test temperatures that includes a minimum test temperature and a maximum test temperature. Examples of the minimum test temperature include minimum test temperatures of at most 25° C., at most 20° C., at most 10° C., at most 0° C., at most −10° C., at most −20° C., at most −30° C., at most −40° C., at most −50° C., at most −55° C., at most −60° C., at most −65° C., at most −70° C., or at most −75° C. Examples of the maximum test temperature include maximum test temperatures of at least 50° C., at least 60° C., at least 70° C., at least 80° C., at least 100° C., at least 120° C., at least 140° C., at least 160° C., at least 180° C., at least 200° C., at least 220° C., at least 240° C., at least 260° C., at least 280° C., at least 300° C., at least 320° C., at least 340° C., or at least 360° C.

With continued reference to FIG. 1 and also to FIG. 6, and during this temperature regulation, thermal expansion and/or contraction of the various components of optical probe system 10 and/or of probe assembly 36 thereof may cause a relative magnitude of distance 45, which may be measured between distance sensor 44 and a surface above which the distance sensor is positioned, and distance 46, which may be measured between optical probe 42 and the surface, to vary. Stated another way, a difference between distance 45 and distance 46 may vary with temperature. This distance variation may lead to inaccuracies in the value of distance 46 that may be detected, determined, estimated, and/or calculated utilizing distance sensor 44.

With the above in mind, optical probe systems 10, according to the present disclosure, may be configured to account for, to quantify, and/or to calibrate this distance variation with temperature, such as by observing optical probe 42 and/or distance sensor 44 at various temperatures utilizing horizontal viewing structure 130. This quantification of the distance variation may permit and/or facilitate more accurate determination of distance 46 at various temperatures via measurement of distance 45 with distance sensor 44 combined with knowledge of the distance variation with temperature.

In some examples, and as illustrated in FIGS. 2 and 4-6, calibration substrate 210 may include a notched region 218. Notched region 218 also may be referred to herein as an inclusion 218, an included region 218, a recess 218, and/or a recessed region 218. Notched region 218 additionally or alternatively may be referred to herein as a region of calibration substrate 210 that is shaped to permit and/or facilitate viewing of a structure, such as an optical probe, from two perpendicular, or at least substantially perpendicular, viewing directions 134. The structure may not be vertically above calibration substrate 210 and/or may be located within notched region 218. Viewing directions 134 may extend above, vertically above, or directly above, calibration substrate 210. Additionally or alternatively, viewing directions 134 may be parallel, or at least substantially parallel, to calibration substrate 210.

Notched region 218, when present, may permit and/or facilitate alignment of optical probe 42 with calibration substrate edge 212 while distance sensor 44 is positioned vertically above calibration substrate 210, as illustrated in FIG. 6. Additionally or alternatively, such a configuration may permit and/or facilitate viewing of optical probe 42 from two different, or orthogonal, directions, which are parallel to horizontal calibration substrate surface 214, as discussed in more detail herein, while the distance sensor is positioned vertically above the calibration substrate.

As discussed, horizontal viewing direction 134 may be parallel, or at least substantially parallel, to calibration chuck support surface 112. Stated another way, and with continued reference to FIG. 6, horizontal viewing direction 134 may be within a threshold horizontal viewing angle 136 of being parallel to the calibration chuck support surface. Examples of the threshold horizontal viewing angle include angles of at least 1 degree, at least 2 degrees, at least 4 degrees, at least 6 degrees, at least 8 degrees, at least 10 degrees, at most 15 degrees, at most 10 degrees, at most 8 degrees, at most 6 degrees, at most 4 degrees, at most 2 degrees, at most 1 degree, at most 0.5 degrees, and/or at most 0.1 degrees.

Horizontal viewing structure 130 may include any suitable structure that may be adapted, configured, designed, and/or constructed to permit and/or facilitate viewing of horizontally viewed region 132 from horizontal viewing direction 134 by and/or with imaging device 60. As an example, the horizontal viewing structure may include a mirror 138 that defines a planar mirror surface 140.

As perhaps best illustrated in FIG. 6, planar mirror surface 140 may extend at a mirror surface angle 142 relative to calibration chuck support surface 112. The mirror surface angle may be selected to permit and/or facilitate viewing of the horizontally viewed region by the imaging device. Examples of the mirror surface angle include a skew angle and/or angles of at least 10 degrees, at least 15 degrees, at least 20 degrees, at least 25 degrees, at least 30 degrees, at least 35 degrees, at least 40 degrees, at least 41 degrees, at least 42 degrees, at least 43 degrees, at least 44 degrees, at least 45 degrees, at most 80 degrees, at most 75 degrees, at most 70 degrees, at most 65 degrees, at most 60 degrees, at most 55 degrees, at most 50 degrees, at most 49 degrees, at most 48 degrees, at most 47 degrees, at most 46 degrees, and/or at most 45 degrees. In a specific example, mirror surface angle 142 may be 45 degrees or may be at least substantially equal to 45 degrees.

Calibration chuck 100 and/or horizontal viewing structure 130 thereof may include a horizontal illumination assembly 144. The horizontal illumination assembly may be configured to illuminate horizontally viewed region 132 with a horizontal light beam 146 that may be directed along, at least partially along, parallel to, at least substantially parallel to, coextensive with, and/or at least partially coextensive with horizontal viewing direction 134, as illustrated in FIGS. 2, and 4-6.

In some examples, horizontal illumination assembly 144 may include a horizontal illumination assembly light source 148, which may be configured to produce, generate, and/or emit an illumination light beam that defines the horizontal light beam, as illustrated in FIGS. 2 and 6. Examples of the horizontal illumination assembly light source include a horizontal illumination assembly light emitting diode, a horizontal illumination assembly fiber optic cable, and/or a light guide.

In some examples, and as perhaps best illustrated in FIG. 6 in dash-dot lines, horizontal illumination assembly 144, or horizontal illumination assembly light source 148 thereof, may emit horizontal light beam 146 along horizontal viewing direction 134, and/or parallel to calibration chuck support surface 112. In these examples, the horizontal illumination assembly light source may be configured to direct the horizontal light beam toward and/or incident upon mirror 138, such as to back-illuminate any structure(s) within horizontally viewed region 132, such as optical probe 42 and/or calibration substrate edge 212. Additionally or alternatively, horizontal illumination assembly light source 148 may be mounted to, may be operatively attached to, and/or may form a portion of calibration chuck 100.

In some examples, the horizontal illumination assembly may include a horizontal illumination assembly reflective surface 150. In these examples, and as illustrated in dotted lines in FIG. 6, the horizontal illumination assembly may be configured to direct the horizontal light beam incident upon horizontal illumination assembly reflective surface 150, which may reflect the horizontal light beam in the horizontal viewing direction and toward and/or incident upon mirror 138, such as to back-illuminate the structure(s) within the horizontally viewed region. As a more specific example, and as illustrated in FIG. 6, horizontal illumination assembly 144 may be positioned vertically above calibration chuck 100 and/or may be incorporated into imaging device 60. In such a configuration, horizontal illumination assembly 144 may be configured to reflect horizontal light beam 146 from mirror 138, then from horizontal illumination assembly reflective surface 150, and then from mirror 138 such that the horizontal light beam returns to imaging device 60.

Mirror 138, when, present, may include and/or be any suitable structure that may define planar mirror surface 140 and/or that may reflect light, such as horizontal light beam 146. Examples of mirror 138 include a reflective surface, a surface that is coated with a reflective material, and/or a surface of a prism.

As illustrated, horizontal viewing structure 130 may extend above, or vertically above, calibration chuck support surface 112. Stated another way, the horizontal viewing structure may project from the calibration chuck support surface. Such a configuration may permit and/or facilitate viewing of a horizontally viewed region 132 that also is vertically above the calibration chuck support surface.

As illustrated in dashed lines in FIGS. 2 and 6, horizontal illumination assembly 144 may include a horizontal illumination assembly adjustment mechanism 152. Horizontal illumination assembly adjustment mechanism 152, when present, may be configured to selectively adjust an orientation of horizontal illumination assembly reflective surface 150, such as to permit and/or facilitate reflection of horizontal light beam 146 from the horizontal illumination assembly reflective surface and back to and/or incident upon imaging device 60. As an example, horizontal illumination assembly adjustment mechanism 152 may be configured to rotate horizontal illumination assembly reflective surface 150 about a rotation axis 154 that may extend parallel, or at least substantially parallel, to calibration chuck support surface 112, as illustrated in FIG. 6. This rotation about rotation axis 154 is indicated by motion of horizontal illumination assembly reflective surface 150 between the orientation that is shown in solid lines and the orientation that is shown in dashed lines. Examples of horizontal illumination assembly adjustment mechanism 152 include a manually actuated adjustment mechanism, a micrometer, a rack and pinion assembly, a ball screw and nut assembly, an electric actuator, a piezoelectric actuator, a motor, an electric motor, a stepper motor, and/or a rotary actuator.

Horizontal illumination assembly adjustment mechanism 152, when present, may be configured to rotate horizontal illumination assembly reflective surface 150 about rotation axis 154 any suitable amount and/or by any suitable angle of rotation. Examples of the angle of rotation include angles of at least 0.5 degrees, at least 1 degree, at least 2 degrees, at least 4 degrees, at least 6 degrees, at least 8 degrees, at most 20 degrees, at most 15 degrees, at most 10 degrees, at most 8 degrees, and/or at most 6 degrees.

In some examples, and as illustrated in FIGS. 2-5, calibration chuck 100 may include a plurality of horizontal viewing structures 130, which include at least a first horizontal viewing structure 1301 and a second horizontal viewing structure 1302. In these examples, first horizontal viewing structure 1301 may be configured to facilitate viewing of a first horizontally viewed region 1321 from a first horizontal viewing direction 1341. Similarly, second horizontal viewing structure 1302 may be configured to facilitate viewing of a second horizontally viewed region 1322 from a second horizontal viewing direction 1342.

Second horizontal viewing direction 1342 may be parallel, or at least substantially parallel, to calibration chuck support surface 112. Additionally or alternatively, second horizontal viewing direction 1342 may be perpendicular, or at least substantially perpendicular, to first horizontal viewing direction 1341. Similar to first horizontally viewed region 1321, second horizontally viewed region 1322 may include optical probe 42, another optical probe 42, calibration substrate edge 212, and/or another calibration substrate edge 212.

As illustrated in FIGS. 2-5, and while not required, first horizontal viewing structure 1301 and second horizontal viewing structure 1302 may view different horizontally viewed regions 132 of a given calibration substrate 210 and/or may view the given calibration substrate from two different, perpendicular, or at least substantially perpendicular, horizontal viewing directions 134. As illustrated in dashed lines in FIG. 2 and in solid lines in FIGS. 3-5, calibration chucks 100 may include a plurality of spaced-apart and/or distinct horizontal viewing assemblies 130, each of which may be configured to view a corresponding, or a different, horizontally viewed region from a corresponding, or different, horizontal viewing direction. This may include horizontal viewing of the same, or different, calibration substrates 210 and/or optical probes 42.

Another example of optical calibration structure 120 includes a vertical viewing structure 160, as illustrated in FIGS. 2-4 and 8-11. As discussed in more detail herein with reference to FIGS. 8-11, vertical viewing structure 160 may be configured to permit and/or facilitate viewing of a vertically viewed region 162 from a vertical viewing direction 164 that may be perpendicular, or at least substantially perpendicular, to calibration chuck support surface 112 and/or that may be directed away from calibration chuck support surface 112.

This may include viewing of the vertically viewed region with, via, and/or utilizing imaging device 60, which may be positioned above, or vertically above, the calibration chuck support surface. Vertical viewing structure 160 may be configured to permit viewing of vertically viewed regions 162 that may not be directly viewable by the imaging device and/or that the imaging device otherwise may be unable to view. Examples of the vertically viewed region include optical probe 42, a lower surface of the optical probe, an optical fiber of the optical probe, a lens of the optical fiber of the optical probe, light emitted by the optical fiber of the optical probe, an edge of the optical probe, electrical probe 38, an RF probe, a DC probe, and/or a mechanical probe of the probe system. The vertically viewed region additionally or alternatively may include a lower surface of any probe, such as the electrical probe, the RF probe, the DC probe, and/or the mechanical probe.

Vertical viewing structure 160 may facilitate viewing of the vertically viewed region in any suitable manner. As an example, the vertical viewing structure may be configured to utilize at least one, or even two, reflections to facilitate viewing of the vertically viewed region.

It is within the scope of the present disclosure that vertical viewing direction 164 may be within a threshold vertical viewing angle of being perpendicular to calibration chuck support surface 112. Stated another way, the vertical viewing direction may be within the threshold vertical viewing angle of being parallel to a surface normal direction of the calibration chuck support surface. Examples of the threshold vertical viewing angle include angles of at least 1 degree, at least 2 degrees, at least 4 degrees, at least 6 degrees, at least 8 degrees, at least 10 degrees, at most 15 degrees, at most 10 degrees, at most 8 degrees, at most 6 degrees, at most 4 degrees, at most 2 degrees, at most 1 degree, at most 0.5 degrees, and/or at most 0.1 degrees.

Figure 8:
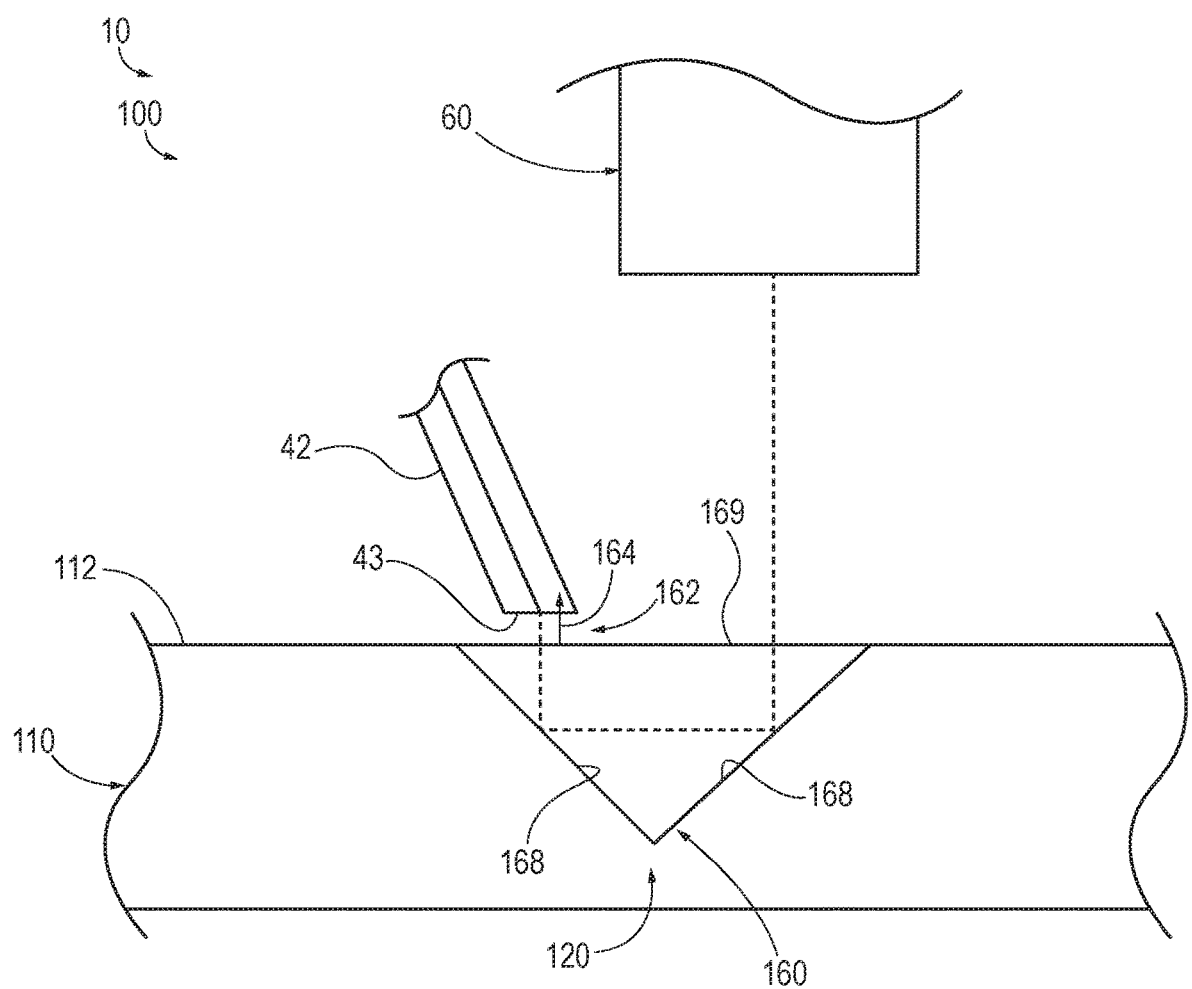
FIG. 8 is an illustration of an example of a test that may be performed utilizing a vertical viewing structure, according to the present disclosure.
Figure 9:
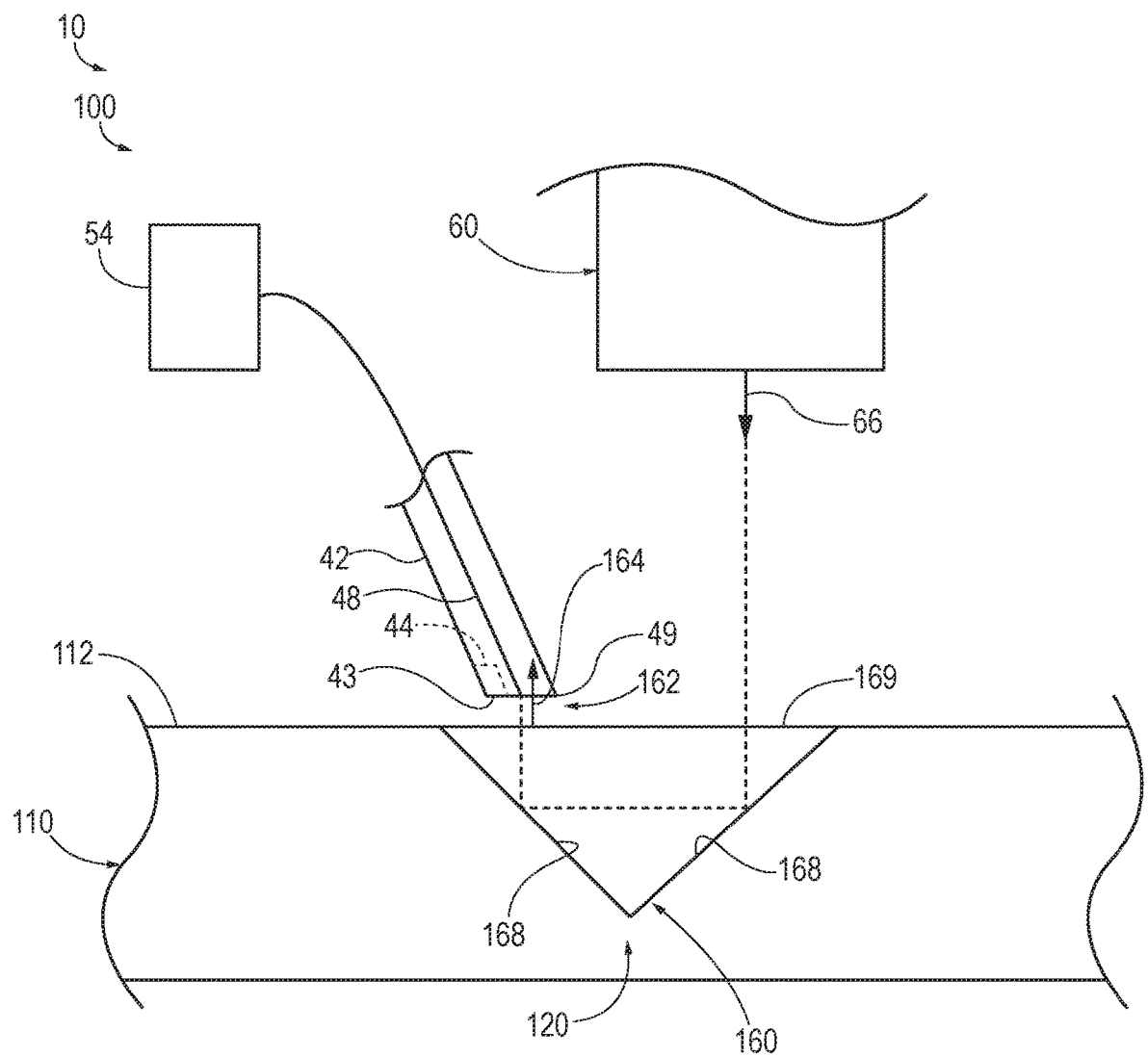
FIG. 9 is an illustration of an example of another test that may be performed utilizing a vertical viewing structure, according to the present disclosure.

Vertical viewing structure 160 may include any suitable structure. As examples, the vertical viewing structure may include a prism, a right angle prism, a gradient index lens, a gradient index lens with fiber assembly, and/or a pair of gradient index lenses interconnected with a fiber assembly. In a specific example, and as illustrated in FIGS. 8-9 and 12, vertical viewing structure 160 may be at least partially embedded within calibration chuck body 110 and/or may include a prism that includes an optically reflective surface 168, or even two optically reflective surfaces 168. The vertical viewing structure additionally or alternatively may include an optically transmissive surface 169.

Vertical viewing structure 160 may be utilized in any suitable manner. As an example, and as illustrated in FIG. 8, the vertical viewing structure may be utilized to view underside 43 of optical probe 42, such as to quantify and/or assess a condition and/or a cleanliness of the optical probe. In this example, imaging device 60 may face toward calibration chuck support surface 112; however, light collected by the imaging device may be reflected, within vertical viewing structure 160, such that vertically viewed region 162 includes underside 43 of optical probe 42. In this configuration, probe system 10 may collect an optical image of the underside of the optical probe and/or may display the optical image for a user of the probe system, such as with, via, and/or utilizing display 84 of FIG. 1.

Figure 10:
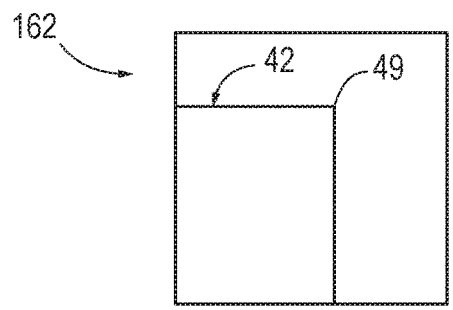
FIG. 10 is an example of an image that may be collected during the test illustrated in FIG. 9.
Figure 11:
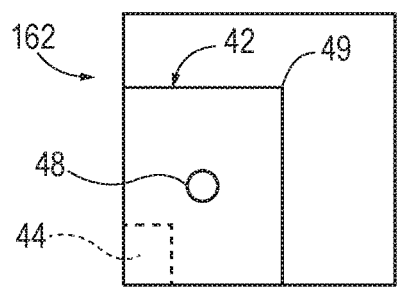
FIG. 11 is an example of another image that may be collected during the test illustrated in FIG. 9.

As another example, and as illustrated in FIGS. 9-11, the vertical viewing structure may be utilized to view both underside 43 and a reference structure 49 of optical probe 42. In this example, imaging device 60 may be utilized to collect a top-down image of reference structure 49. An example of such a top-down image is illustrated in FIG. 10, where reference structure 49 includes a corner and/or other feature of optical probe 42 that is visible from above and/or from viewing direction 66. This may include adjustment of a focal plane location of the imaging device such that the imaging device collects the top-down image of the reference structure, as viewed from a viewing direction 66 of the imaging device.

In addition, the focal plane location of the imaging device may be adjusted such that the imaging device also collects a bottom-up image of underside 43 of the optical probe. This may include reflection of light within vertical viewing structure 160 such that the image of underside 43 is collected from vertical viewing direction 164. During collection of the bottom-up image of underside 43, a light source 54 may provide light to a probe fiber 48 of the optical probe. An example of the bottom-up image is illustrated in FIG. 11. Because probe fiber 48 is illuminated by light source 54, a location of the probe fiber within underside 43 readily may be determined, and a relative orientation between probe fiber 48 and reference structure 49 may be established.

This may permit and/or facilitate subsequent alignment between probe fiber 48 and an optical device solely via a top-down view of the optical probe. Stated another way, the above-described procedure, or method, may be utilized to calibrate, or to correlate, the location of the probe fiber and the location of the reference structure, thereby permitting subsequent alignment between the probe fiber and the optical device without the need for, or without utilizing, vertical viewing structure 160. Additionally or alternatively, in an optical probe system 10 that includes and/or utilizes multiple optical probes and/or multiple optical channels, the configuration of FIGS. 9-11 may be utilized to verify which optical channel is connected to a given optical probe.

In a variation on the above methods, and with continued reference to FIGS. 9 and 11, vertical viewing structure 160 may be utilized to collect an optical image, from vertical viewing direction 164, that includes both probe fiber 48 and a distance sensor 44 of the optical probe assembly. This may permit and/or facilitate calibration and/or correlation of a relative location between the probe fiber and the distance sensor during subsequent probing operations without the need to repeatedly view underside 43 of probe 42.

Another example of optical calibration structure 120 includes a probe alignment structure 170. As illustrated in FIG. 12, probe alignment structure 170 may be configured to facilitate relative alignment between at least two optical probes 42 of optical probe system 10. Probe alignment structure 170 may include and/or be any suitable structure that may permit and/or facilitate the alignment between the probes. As an example, probe alignment structure 170 may include and/or be vertical viewing structure 160. Stated another way, the same optical calibration structure 120 may function as both vertical viewing structure 160 and probe alignment structure 170. As another example, and as illustrated in FIG. 12, probe alignment structure 170 may include a pair of gradient index (GRIN) lenses 176 and an optical fiber 178 that interconnects GRIN lenses 176.

Probe alignment structure 170 may be utilized in any suitable manner. As an example, and as illustrated in FIG. 12, two optical probes 42 may be configured to face toward the probe alignment structure. In this configuration, an emitting optical probe 42 may be configured to receive an optical signal from a light source 54 and/or to emit an emitted optical signal 174, which also may be referred to herein as optical test signal 52. Probe alignment structure 170, or a corresponding GRIN lens of the probe alignment structure, may receive the emitted optical signal and direct the emitted optical signal incident upon a detecting optical probe 42, such as via optical fiber 178 and another GRIN lens 176.

The emitted optical signal, as received by the detecting optical probe, also may be referred to herein as an optical resultant signal 56. The detecting optical probe then may convey the emitted optical signal to a light detector 58, which may detect any suitable property of the emitted optical signal. In the above configuration, a relative orientation between optical probes 42 may be changed and/or adjusted, based upon the detected property of the emitted optical signal, to permit and/or facilitate a desired degree of alignment between the optical probes.

Returning to FIG. 2, optical calibration structure 120 may include a calibration chuck light source 180. Calibration chuck light source 180, when present, may be configured to direct a beam of calibration light 182 away from calibration chuck 100. As an example, the calibration chuck light source may be configured to direct the beam of calibration light in a calibration light direction that may be parallel, or at least substantially parallel, to vertical viewing direction 164 of vertical viewing structure 160, may be parallel, or at least substantially parallel, to a surface normal direction of calibration chuck support surface 112, and/or may be perpendicular, or at least substantially perpendicular, to calibration chuck support surface 112.

Calibration chuck light source 180 may include any suitable structure. As an example, the calibration chuck light source may include and/or be a calibration chuck laser 186. Examples of the beam of calibration light include a laser beam, a monochromatic light beam, and/or a polarized light beam.

During operation of optical probe systems 10, calibration chuck light source 180 may be configured to direct beam of calibration light 182 incident upon an optical probe, such as optical probe 42 of FIG. 1, of the optical probe system. The optical probe may be aligned with the calibration chuck light source, and at least one property of the light collected by the optical probe may be determined and/or quantified, such as via light detector 58 of FIG. 1.

This process may be repeated for a plurality of optical probes 42 of the optical probe system, thereby permitting calibration of the plurality of optical probes. Stated another way, calibration chuck light source 180 may be utilized to provide a known, a well-controlled, a consistent, and/or a reproducible beam of calibration light 182 to each probe of the plurality of probes. In such a configuration, probe system 10 may utilize differences and/or variations in the at least one property of light collected by each optical probe to calibrate and/or quantify differences in light collection characteristics and/or properties among the plurality of optical probes.

Turning to FIGS. 2-4, optical calibration structure 120 may include a calibration chuck light detector 190. Calibration chuck light detector 190, when present, may be configured to detect an optical signal, such as light, that may be incident thereupon and/or to quantify at least one property of the light. This may include detection of the light from a detection direction 192, as illustrated in FIG. 3. Detection direction 192 may be parallel, or at least substantially parallel, to vertical viewing direction 164 of vertical viewing structure 160, may be parallel, or at least substantially parallel, to a surface normal direction of calibration chuck support surface 112, and/or may be perpendicular, or at least substantially perpendicular, to calibration chuck support surface 112.

Additionally or alternatively, calibration chuck light detector 190 may include a light-directing structure 196, as illustrated in FIG. 2. Light-directing structure 196 may be configured to direct light that is incident upon the light-directing structure toward and/or incident upon calibration chuck light detector 190. Such a configuration may permit and/or facilitate collection of light by calibration chuck light detector 190 that initially was emitted and/or directed at any suitable angle with respect to vertical viewing direction 164. Examples of light-directing structure 196 include any suitable prism, mirror, and/or lens.

Calibration chuck light detector 190 may include any suitable structure. As an example, the calibration chuck light detector may include and/or be a calibration chuck photo detector, a calibration chuck photo diode, and/or an optical power meter.

During operation of optical probe system 10, calibration chuck light detector 190 may be configured to receive the light from an optical probe, such as optical probe 42 of FIG. 1, of the optical probe system. The optical probe may be aligned with the calibration chuck light detector, and at least one property of light collected by the calibration chuck light detector may be determined and/or quantified by the calibration chuck light detector.

This process may be repeated for a plurality of optical probes 42 of the optical probe system, thereby permitting calibration of the plurality of optical probes. Stated another way, calibration chuck light detector 190 may be utilized as a known, a well-controlled, a consistent, and/or a single detector that detects light from each probe of the plurality of probes. In such a configuration, optical probe system 10 may utilize differences and/or variations in the at least one property of light collected by the calibration chuck light detector to calibrate and/or quantify differences in light emission properties and/or characteristics among the plurality of optical probes.

In some examples, calibration chuck 100 may include an obstructive calibration structure 194. As illustrated in FIGS. 2-4, obstructive calibration structure 194 may be associated with calibration chuck light detector 190. The obstructive calibration structure may be configured to selectively obstruct a portion of the optical signal that is directed toward calibration chuck light detector 190 such that an obstructed portion of the optical signal is not incident upon the calibration chuck light detector. As discussed in more detail herein, such a configuration may permit and/or facilitate characterization of the optical signal. Examples of the obstructive calibration structure include a knife edge calibration structure and/or a pinhole calibration structure. Another example of the obstructive calibration structure includes a polarization-sensitive grating.

When calibration chuck 100 includes obstructive calibration structure 194 in the form of the knife edge calibration structure, the knife edge calibration structure and the calibration chuck light detector may be positioned, relative to one another, such that the calibration chuck light detector extends around an external periphery of the knife edge calibration structure and/or such that the knife edge calibration structure blocks the optical signal from being incident upon a region of the calibration chuck light detector that is internal to the external periphery of the knife edge calibration structure but permits the optical signal to be incident upon a region of the calibration chuck light detector that extends around, or external to, the external periphery of the knife edge calibration structure. In such an example, the knife edge calibration structure may block light from being incident upon a region of calibration chuck light detector 190 that is covered by, or within, the rectangle indicated at 194, while a region of the calibration chuck light detector that is external the rectangle indicated at 194 may receive the light.

In this example, by moving the optical signal across the knife edge calibration structure, different portions, or fractions, of the optical signal may be incident upon the calibration chuck light detector. Such a configuration may permit and/or facilitate characterization of one or more spatial characteristics of the optical signal.

When calibration chuck 100 includes obstructive calibration structure 194 in the form of the pinhole calibration structure, the pinhole calibration structure and the calibration chuck light detector may be positioned, relative to one another, such that the optical signal is incident upon the calibration chuck light detector via the pinhole calibration structure, or via a pinhole of the pinhole calibration structure. In such an example, the pinhole calibration structure may block light from being incident upon a region of calibration chuck light detector 190 that is external the rectangle indicated at 194, while a region of the calibration chuck light detector that is within the rectangle indicated at 194 may receive the light.

In this example, by moving the optical signal across the pinhole calibration structure, different portions, or fractions, of the optical signal may be incident upon the calibration chuck light detector via the pinhole. Such a configuration once again may permit and/or facilitate characterization of one or more spatial characteristics of the optical signal.

When calibration chuck 100 includes obstructive calibration structure 194 in the form of the polarization-sensitive grating, the optical calibration structure may be utilized to detect and/or monitor a polarization state of the optical signal and/or a change in the polarization state of the optical signal. Such a configuration may, for example, permit quantification of polarization drift, such as may be caused by thermal and/or environmental changes. Such polarization drift may cause measurement drift and/or may degrade measurement performance. With this in mind, the polarization-sensitive grating may permit and/or facilitate improved and/or more accurate measurements by permitting optical probe systems 10 to detect, to account for, and/or to correct for the polarization drift.

Turning to FIGS. 2-4 and 13, optical calibration structure 120 may include an optical device 200. Examples of optical device 200 include an optically active structure, a singulated optical chip, a silicon photonics device, and/or a user-provided substrate. In such a configuration, optical device 200 may include one or more known optical structures that may be tested by optical probe system 10 and/or that may be utilized to calibrate optical probe system 10. Optical device 200, when present, may be formed and/or defined on and/or by a single substrate. Additionally or alternatively, optical calibration structure 120 may include a plurality of distinct optical devices 200 that may be defined by separate and/or distinct substrates.

In some examples, calibration chuck 100 may include a die holder 230, and optical device 200, which may include and/or be a user-provided optical device, may be operatively attached to calibration chuck 100 and/or may be positioned within die holder 230. Die holder 230 also may contain and/or hold one or more reference substrates 240. Reference substrates 240 may be configured to provide a reference surface for distance sensor 44 when optical probe assembly 40 is utilized to test, to provide an optical signal to, and/or to receive an optical signal from optical device 200. As an example, and as perhaps best illustrated in FIG. 13, reference substrates 240 may include recessed regions 242. The presence of recessed regions 242 may permit an optical probe to be positioned proximate an edge 202 of optical device 200, such as to permit and/or facilitate edge coupling between the optical probe and optical device 200.

In some examples, die holder 230 also may include, or may be associated with, a corresponding horizontal viewing structure 130. As examples, and as illustrated in FIGS. 3-4 and 13, die holder 230 may include and/or be associated with a pair of mirrors 138 and a corresponding pair of horizontal illumination assemblies 144, which may be utilized to view and/or image corresponding horizontally viewed regions, as discussed in more detail herein. This may permit and/or facilitate viewing of optical device 200, of reference substrates 240, and/or of optical probes that may be utilized to interact with and/or to test optical device 200.

Optical probe systems 10 and/or calibration chucks 100, according to the present disclosure, may be utilized in a number of ways and/or may perform a number of different methods, examples of which have been disclosed herein. In a general sense, methods of operating, utilizing, and/or calibrating probe systems 10 may include aligning at least one optical probe 42 with at least one optical calibration structure 120 and collecting data utilizing the at least one optical probe and/or the at least one optical calibration structure. The collecting data may include providing an optical test signal 52 to the at least one optical calibration structure via the at least one probe. The collecting data additionally or alternatively may include receiving an optical resultant signal from the at least one optical calibration structure via the at least one probe. The collecting data additionally or alternatively may include collecting an optical image utilizing the at least one optical calibration structure. The optical image may include the at least one probe and/or any other suitable structure and/or component of the optical probe system, examples of which are disclosed herein.

In the present disclosure, several of the illustrative, non-exclusive examples have been discussed and/or presented in the context of methods of operating and/or utilizing probe systems and/or calibration chucks. Unless specifically set forth in the accompanying description, it is within the scope of the present disclosure that the order of the steps described within these methods may vary from the disclosed order, including with two or more of the steps occurring in a different order and/or concurrently. It is also within the scope of the present disclosure that the steps may be implemented as logic, which also may be described as implementing the steps as logics. In some applications, the steps may represent expressions and/or actions to be performed by functionally equivalent circuits or other logic devices. The described methods and/or steps thereof may, but are not required to, represent executable instructions that cause a computer, processor, and/or other logic device to respond, to perform an action, to change states, to generate an output or display, and/or to make decisions.

As used herein, the term "and/or" placed between a first entity and a second entity means one of (1) the first entity, (2) the second entity, and (3) the first entity and the second entity. Multiple entities listed with "and/or" should be construed in the same manner, i.e., "one or more" of the entities so conjoined. Other entities may optionally be present other than the entities specifically identified by the "and/or" clause, whether related or unrelated to those entities specifically identified. Thus, as a non-limiting example, a reference to "A and/or B," when used in conjunction with open-ended language such as "comprising" may refer, in one embodiment, to A only (optionally including entities other than B); in another embodiment, to B only (optionally including entities other than A); in yet another embodiment, to both A and B (optionally including other entities). These entities may refer to elements, actions, structures, steps, operations, values, and the like.

As used herein, the phrase "at least one," in reference to a list of one or more entities should be understood to mean at least one entity selected from any one or more of the entities in the list of entities, but not necessarily including at least one of each and every entity specifically listed within the list of entities and not excluding any combinations of entities in the list of entities. This definition also allows that entities may optionally be present other than the entities specifically identified within the list of entities to which the phrase "at least one" refers, whether related or unrelated to those entities specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including entities other than B); in another embodiment, to at least one, optionally including more than one, B, with no A present (and optionally including entities other than A); in yet another embodiment, to at least one, optionally including more than one, A, and at least one, optionally including more than one, B (and optionally including other entities). In other words, the phrases "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C," and "A, B, and/or C" may mean A alone, B alone, C alone, A and B together, A and C together, B and C together, A, B, and C together, and optionally any of the above in combination with at least one other entity.

In the event that any patents, patent applications, or other references are incorporated by reference herein and (1) define a term in a manner that is inconsistent with and/or (2) are otherwise inconsistent with, either the non-incorporated portion of the present disclosure or any of the other incorporated references, the non-incorporated portion of the present disclosure shall control, and the term or incorporated disclosure therein shall only control with respect to the reference in which the term is defined and/or the incorporated disclosure was present originally.

As used herein the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa.

As used herein, the phrase, "for example," the phrase, "as an example," and/or simply the term "example," when used with reference to one or more components, features, details, structures, embodiments, and/or methods according to the present disclosure, are intended to convey that the described component, feature, detail, structure, embodiment, and/or method is an illustrative, non-exclusive example of components, features, details, structures, embodiments, and/or methods according to the present disclosure. Thus, the described component, feature, detail, structure, embodiment, and/or method is not intended to be limiting, required, or exclusive/exhaustive; and other components, features, details, structures, embodiments, and/or methods, including structurally and/or functionally similar and/or equivalent components, features, details, structures, embodiments, and/or methods, are also within the scope of the present disclosure.

As used herein, "at least substantially," when modifying a degree or relationship, may include not only the recited "substantial" degree or relationship, but also the full extent of the recited degree or relationship. A substantial amount of a recited degree or relationship may include at least 75% of the recited degree or relationship. For example, an object that is at least substantially formed from a material includes objects for which at least 75% of the objects are formed from the material and also includes objects that are completely formed from the material. As another example, a first length that is at least substantially as long as a second length includes first lengths that are within 75% of the second length and also includes first lengths that are as long as the second length. As yet another example, elements that are at least substantially parallel includes elements that extend in directions that deviate by up to 22.5° and also includes elements that are parallel.

Illustrative, non-exclusive examples of calibration chucks, probe systems, and methods according to the present disclosure are presented in the following enumerated paragraphs. It is within the scope of the present disclosure that an individual step of a method recited herein, including in the following enumerated paragraphs, may additionally or alternatively be referred to as a "step for" performing the recited action.

A1. A calibration chuck for an optical probe system, the calibration chuck comprising:
a calibration chuck body that defines a calibration chuck support surface; and
at least one optical calibration structure supported by the calibration chuck body.

A2. The calibration chuck of paragraph A1, wherein the at least one optical calibration structure includes a horizontal viewing structure configured to facilitate viewing of a horizontally viewed region from a horizontal viewing direction that is parallel, or at least substantially parallel, to the calibration chuck support surface.

A3. The calibration chuck of paragraph A2, wherein the horizontal viewing structure is configured to facilitate viewing of the horizontally viewed region via an imaging device of the optical probe system that is positioned vertically above the calibration chuck support surface.

A4. The calibration chuck of any of paragraphs A2-A3, wherein the horizontally viewed region includes an optical probe of the optical probe system.

A5. The calibration chuck of any of paragraphs A2-A4, wherein the horizontally viewed region includes a calibration substrate edge of a calibration substrate of the calibration chuck.

A6. The calibration chuck of paragraph A5, wherein the calibration substrate edge defines a transition between a horizontal calibration substrate surface of the calibration substrate, which is parallel, or at least substantially parallel, to the calibration chuck support surface and a vertical calibration substrate surface of the calibration substrate, which is parallel, or at least substantially parallel, to the calibration chuck support surface.

A7. The calibration chuck of any of paragraphs A2-A6, wherein the horizontal viewing structure is configured to facilitate determination of a distance between an/the optical probe and a/the calibration substrate edge.

A8. The calibration chuck of paragraph A7, wherein the calibration chuck includes the calibration substrate.

A9. The calibration chuck of paragraph A8, wherein the calibration substrate includes a notched region, optionally configured to facilitate alignment of the optical probe proximate the calibration substrate edge and also to facilitate alignment of a distance sensor of the optical probe system vertically above the horizontal calibration substrate surface.

A10. The calibration chuck of any of paragraphs A2-A9, wherein the horizontal viewing direction is within a threshold horizontal viewing angle of parallel to the calibration chuck support surface, optionally wherein the threshold horizontal viewing angle is at least one of:

(i) at least 1 degree, at least 2 degrees, at least 4 degrees, at least 6 degrees, at least 8 degrees, or at least 10 degrees; and (ii) at most 15 degrees, at most 10 degrees, at most 8 degrees, at most 6 degrees, at most 4 degrees, at most 2 degrees, at most 1 degree, at most 0.5 degrees, or at most 0.1 degrees.

A11. The calibration chuck of any of paragraphs A2-A10, wherein the horizontal viewing structure includes a mirror that defines a planar mirror surface that extends at a mirror surface angle relative to the calibration chuck support surface.

A12. The calibration chuck of paragraph A11, wherein the mirror surface angle is at least one of:

(i) a skew angle;

(ii) at least 10 degrees, at least 15 degrees, at least 20 degrees, at least 25 degrees, at least 30 degrees, at least 35 degrees, at least 40 degrees, at least 41 degrees, at least 42 degrees, at least 43 degrees, at least 44 degrees, or at least 45 degrees; and (iii) at most 80 degrees, at most 75 degrees, at most 70 degrees, at most 65 degrees, at most 60 degrees, at most 55 degrees, at most 50 degrees, at most 49 degrees, at most 48 degrees, at most 47 degrees, at most 46 degrees, or at most 45 degrees.

A13. The calibration chuck of any of paragraphs A2-A12, wherein the horizontal viewing structure includes a horizontal illumination assembly configured to illuminate the horizontally viewed region with a horizontal light beam that is directed at least partially along the horizontal viewing direction, optionally wherein the horizontal illumination assembly is configured to back-illuminate the horizontally viewed region.

A14. The calibration chuck of paragraph A13, wherein the horizontal illumination assembly includes a horizontal illumination assembly light source, optionally wherein the horizontal illumination assembly light source includes at least one of:

(i) at least one horizontal illumination assembly light emitting diode;

(ii) at least one horizontal illumination assembly fiber optic cable; and (iii) at least one horizontal illumination assembly light guide.

A15. The calibration chuck of any of paragraphs A13-A14, wherein the horizontal illumination assembly includes a horizontal illumination assembly reflective surface.

A15.1 The calibration chuck of paragraph A15, wherein the horizontal illumination assembly includes a horizontal illumination assembly adjustment mechanism configured to selectively adjust an orientation of the horizontal illumination assembly reflective surface.

A15.2 The calibration chuck of paragraph A15.1, wherein the horizontal illumination assembly adjustment mechanism is configured to rotate the horizontal illumination assembly reflective surface about a rotation axis.

A16. The calibration chuck of any of paragraphs A13-A14, wherein the horizontal illumination assembly is configured to at least one of:

(i) direct the horizontal light beam toward the mirror;

(ii) emit the horizontal light beam at least partially along the horizontal viewing direction; and (iii) reflect the horizontal light beam at least partially along the horizontal viewing direction.

A17. The calibration chuck of any of paragraphs A2-A16, wherein the horizontal viewing structure extends vertically above the calibration chuck support surface.

A18. The calibration chuck of any of paragraphs A2-A17, wherein the horizontal viewing structure is a first horizontal viewing structure, wherein the horizontally viewed region is a first horizontally viewed region, wherein the horizontal viewing direction is a first horizontal viewing direction, and further wherein the at least one optical calibration structure includes a second horizontal viewing structure configured to facilitate viewing of a second horizontally viewed region from a second horizontal viewing direction that is parallel, or at least substantially parallel, to the calibration chuck support surface.

A19. The calibration chuck of paragraph A18, wherein the second horizontal viewing direction is perpendicular, or at least substantially perpendicular, to the first horizontal viewing direction.

A20. The calibration chuck of any of paragraphs A18-A19, wherein the second horizontally viewed region includes at least one of:

(i) an/the optical probe of the optical probe system;

(ii) a/the calibration substrate edge of a/the calibration substrate; and (iii) another calibration substrate edge of the calibration substrate.

A21. The calibration chuck of any of paragraphs A1-A20, wherein the at least one optical calibration structure includes a vertical viewing structure configured to facilitate viewing of a vertically viewed region from a vertical viewing direction that is perpendicular, or at least substantially perpendicular, to the calibration chuck support surface.

A22. The calibration chuck of paragraph A21, wherein the vertical viewing structure is configured to facilitate viewing of the vertically viewed region via an/the imaging device of the optical probe system that is positioned vertically above the calibration chuck support surface.

A23. The calibration chuck of any of paragraphs A21-A22, wherein the vertical viewing structure is configured to utilize at least one reflection, and optionally at least two reflections, to facilitate viewing of the vertically viewed region.

A24. The calibration chuck of any of paragraphs A21-A23, wherein the vertically viewed region includes an/the optical probe of the optical probe system, optionally wherein the vertically viewed region includes at least one of:

(i) a lower surface of the optical probe;

(ii) an optical fiber of the optical probe;

(iii) a lens of the optical fiber of the optical probe;

(iv) light emitted by the optical fiber of the optical probe;

(v) an edge of the optical probe;

(vi) an electrical probe;

(vii) an RF probe;

(viii) a DC probe;

(ix) a mechanical probe; and (x) a lower surface of a probe.

A25. The calibration chuck of any of paragraphs A21-A24, wherein the vertical viewing direction is within a threshold vertical viewing angle of perpendicular to the calibration chuck support surface, optionally wherein the threshold vertical viewing angle is at least one of:

(i) at least 1 degrees, at least 2 degrees, at least 4 degrees, at least 6 degrees, at least 8 degrees, or at least 10 degrees; and (ii) at most 15 degrees, at most 10 degrees, at most 8 degrees, at most 6 degrees, at most 4 degrees, at most 2 degrees, at most 1 degree, at most 0.5 degrees, or at most 0.1 degrees.

A26. The calibration chuck of any of paragraphs A21-A25, wherein the vertical viewing structure includes at least one of:
(i) a prism;
(ii) a right angle prism; and
(iii) a gradient index lens with fiber assembly.

A27. The calibration chuck of any of paragraphs A21-A26, wherein the vertical viewing structure is embedded at least partially within the calibration chuck body.

A28. The calibration chuck of any of paragraphs A21-A27, wherein the vertical viewing structure includes at least one optically reflective surface, optionally at least two optically reflective surfaces, and further optionally at least two optically reflective surfaces and an optically transmissive surface.

A29. The calibration chuck of any of paragraphs A1-A28, wherein the at least one optical calibration structure includes a probe alignment structure configured to facilitate relative alignment between at least two optical probes of the optical probe system.

A30. The calibration chuck of any of paragraphs A1-A28, wherein the optical calibration structure includes, and optionally is, a/the vertical viewing structure.

A31. The calibration chuck of paragraph A30, wherein a vertically reflective structure defines both the probe alignment structure and a/the vertical viewing structure.

A32. The calibration chuck of any of paragraphs A30-A31, wherein the at least two optical probes of the optical probe assembly face toward the probe alignment structure, and further wherein the probe alignment structure is configured to receive an emitted optical signal from an emitting optical probe of the at least two optical probes and direct the emitted optical signal incident upon a detecting optical probe of the at least two optical probes.

A33. The calibration chuck of any of paragraphs A1-A32, wherein the at least one optical calibration structure includes a calibration chuck light source configured to direct a beam of calibration light away from the calibration chuck.

A34. The calibration chuck of paragraph A33, wherein the calibration chuck light source is configured to direct the beam of calibration light in a calibration light direction that is at least substantially parallel to a/the vertical viewing direction.

A35. The calibration chuck of any of paragraphs A33-A34, wherein the calibration chuck light source includes a calibration chuck laser.

A36. The calibration chuck of any of paragraphs A33-A35, wherein the beam of calibration light includes at least one of:
(i) a laser beam;
(ii) a monochromatic light beam; and
(iii) a polarized light beam.

A37. The calibration chuck of any of paragraphs A33-A36, wherein the calibration chuck light source is configured to direct the beam of calibration light incident upon an/the optical probe of the optical probe system.

A38. The calibration chuck of any of paragraphs A1-A37, wherein the at least one optical calibration structure includes a calibration chuck light detector configured to detect light that is incident thereupon.

A39. The calibration chuck of paragraph A38, wherein the calibration chuck light detector is configured to detect the light from a detection direction that is at least substantially parallel to a/the vertical viewing direction.

A40. The calibration chuck of any of paragraphs A38-A39, wherein the calibration chuck light detector includes at least one of a calibration chuck photo detector, a calibration chuck photo diode, and an optical power meter.

A41. The calibration chuck of any of paragraphs A38-A40, wherein the calibration chuck light detector is configured to receive the light from an/the optical probe of the optical probe system.

A41.1 The calibration chuck of any of paragraphs A38-A41, wherein the calibration chuck further includes an obstructive calibration structure that is associated with the calibration chuck light detector, optionally wherein the obstructive calibration structure is configured to selectively obstruct a portion of an optical signal that is directed toward the calibration chuck light detector, optionally to facilitate characterization of the optical signal.

A41.2 The calibration chuck of paragraph A41.1, wherein the obstructive calibration structure includes at least one of a knife edge calibration structure and a pinhole calibration structure.

A42. The calibration chuck of any of paragraphs A1-A41.2, wherein the at least one optical calibration structure includes at least one of:
(i) an optically active structure;
(ii) an optical device; and
(iii) a singulated optical chip.

A43. The calibration chuck of any of paragraphs A1-A42, wherein the calibration chuck further includes a die holder configured to contain an optical device.

A44. The calibration chuck of paragraph A43, wherein the die holder further includes a reference substrate.

A45. The calibration chuck of any of paragraphs A43-A44, wherein the die holder further includes a corresponding horizontal viewing structure configured to view a corresponding horizontally viewed region that includes at least one of the optical device and a/the reference substrate.

A46. The calibration chuck of paragraph A45, wherein the corresponding horizontal viewing structure includes any suitable structure and/or component of any of the horizontal viewing structures of any of paragraphs A2-A20.

B1. An optical probe system, comprising:
a device substrate chuck defining a device substrate support surface configured to support a device substrate that includes a plurality of optical devices;
an optical probe assembly including at least one optical probe;
a signal generation and analysis assembly configured to at least one of provide an optical test signal to the at least one optical probe and receive an optical resultant signal from the at least one optical probe;
the calibration chuck of any of paragraphs A1-A46, and
an imaging device positioned vertically above the device substrate chuck and the calibration chuck.

B2. The optical probe system of paragraph B1, wherein the device substrate chuck includes a thermal control unit configured to regulate a temperature of the device substrate.

B3. The optical probe system of any of paragraphs B1-B2, wherein the optical probe system further includes a device substrate chuck translation structure configured to at least one of:
(i) operatively translate the device substrate chuck relative to the optical probe assembly;
(ii) operatively rotate the device substrate chuck relative to the optical probe assembly;
(iii) operatively translate the device substrate chuck relative to the imaging device;
and
(iv) operatively rotate the device substrate chuck relative to the imaging device.

B4. The optical probe system of any of paragraphs B1-B3, wherein the calibration chuck is operatively attached to, and configured to move with, the device substrate chuck.

B5. The optical probe system of any of paragraphs B1-B4, wherein the device substrate includes a semiconductor wafer, optionally wherein the optical probe system includes the semiconductor wafer.

B6. The optical probe system of any of paragraphs B1-B5, wherein the plurality of optical devices includes a plurality of silicon photonics optical devices.

B7. The optical probe system of any of paragraphs B1-B6, wherein the at least one optical probe includes a fiber optic probe.

B8. The optical probe system of any of paragraphs B1-B7, wherein the optical probe assembly includes a plurality of optical probes.

B9. The optical probe system of any of paragraphs B1-B8, wherein the optical probe assembly further includes a distance sensor configured to determine a distance between the at least one optical probe and the device substrate when the optical probe system is utilized to optically test at least one optical device of the device substrate.

B10. The optical probe system of paragraph B9, wherein the distance sensor includes at least one of a capacitive distance sensor, a capacitive displacement sensor, an eddy current displacement sensor, a laser triangulation sensor, a confocal sensor, and/or a spectral interference displacement sensor.

B11. The optical probe system of any of paragraphs B1-B10, wherein the optical probe system further includes an optical probe assembly translation structure configured to at least one of:

(i) operatively translate the optical probe assembly relative to the device substrate chuck;

(ii) operatively rotate the optical probe assembly relative to the device substrate chuck;

(iii) operatively translate the optical probe assembly relative to the calibration chuck;

(iv) operatively rotate the optical probe assembly relative to the calibration chuck;

(v) operatively translate the optical probe assembly relative to the imaging device; and (vi) operatively rotate the optical probe assembly relative to the imaging device.

B12. The optical probe system of any of paragraphs B1-B11, wherein the signal generation and analysis assembly includes a light source configured to generate the optical test signal.

B13. The optical probe system of paragraph B12, wherein the light source includes a laser light source.

B14. The optical probe system of any of paragraphs B12-B13, wherein the signal generation and analysis assembly includes a light detector configured to detect the optical resultant signal.

B15. The optical probe system of paragraph B14, wherein the light detector includes at least one of a photo detector and a photo diode.

B16. The optical probe system of any of paragraphs B1-B15, wherein the optical probe system further includes a fiber optic cable configured convey at least one of the optical test signal and the optical resultant signal between the signal generation and analysis assembly and the optical probe assembly.

B17. The optical probe system of any of paragraphs B1-B17, wherein the imaging device includes a microscope.

B18. The optical probe system of any of paragraphs B1-B17, wherein the imaging device includes an objective lens.

B19. The optical probe system of any of paragraphs B1-B18, wherein the imaging device is configured to receive an optical image and to generate an electronic representation of the optical image.

B20. The optical probe system of paragraph B19, wherein the optical probe system further includes a display configured to display the electronic representation of the optical image to a user of the optical probe system.

B21. The optical probe system of any of paragraphs B1-B20, wherein the optical probe system further includes an imaging device translation structure configured to at least one of:

(i) operatively translate the imaging device relative to the device substrate chuck;

(ii) operatively rotate the imaging device relative to the device substrate chuck;

(iii) operatively translate the imaging device relative to the calibration chuck;

(iv) operatively rotate the imaging device relative to the calibration chuck;

(v) operatively translate the imaging device relative to the optical probe assembly; and (vi) operatively rotate the imaging device relative to the optical probe assembly.

B22. The optical probe system of any of paragraphs B1-B21, wherein the optical probe system further includes an enclosure that defines an enclosed volume, wherein at lease the device substrate support surface of the device substrate chuck is positioned within the enclosed volume.

C1. A method of utilizing the optical probe system of any of paragraphs B1-B22, the method comprising:

aligning the at least one optical probe with the at least one optical calibration structure; and collecting data utilizing the at least one optical probe and utilizing the at least one optical calibration structure.

C2. The method of paragraph C1, wherein the collecting data includes at least one of:

(i) providing the optical test signal to the at least one optical calibration structure via the at least one probe;

(ii) receiving the optical resultant signal from the at least one optical calibration structure via the at least one probe; and (iii) collecting an optical image of the at least one probe utilizing the at least one optical calibration structure.

INDUSTRIAL APPLICABILITY

The calibration chucks, probe systems, and methods disclosed herein are applicable to the optical device and semiconductor manufacturing and test industries.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower, or equal in scope to the original claims, are also regarded as included within the subject matter of the inventions of the present disclosure.

The invention claimed is:

1. An optical probe system, comprising:
 a device substrate chuck defining a device substrate support surface configured to support a device substrate that includes a plurality of optical devices;
 an optical probe assembly including at least one optical probe;
 a signal generation and analysis assembly configured to at least one of provide an optical test signal to the at least one optical probe and receive an optical resultant signal from the at least one optical probe;
 a calibration chuck comprising:
  (i) a calibration chuck body that defines a calibration chuck support surface; and
  (ii) at least one optical calibration structure supported by the calibration chuck body; and
 an imaging device positioned vertically above the device substrate chuck and the calibration chuck support surface of the calibration chuck;
 wherein the at least one optical calibration structure includes a horizontal viewing structure configured to facilitate viewing of a horizontally viewed region from a horizontal viewing direction that is at least substantially parallel to the calibration chuck support surface via the imaging device.

2. The optical probe system of claim 1, wherein the horizontal viewing structure includes a mirror that defines a planar mirror surface that extends at a skew mirror surface angle relative to the calibration chuck support surface.

3. The optical probe system of claim 1, wherein the horizontal viewing structure extends vertically above the calibration chuck support surface.

4. The optical probe system of claim 1, wherein the at least one optical calibration structure includes a probe alignment structure configured to facilitate relative alignment between at least two optical probes of the optical probe system.

5. The optical probe system of claim 1, wherein the calibration chuck further includes a die holder configured to contain an optical device.

6. A method of utilizing the optical probe system of claim 1, the method comprising:
 aligning the at least one optical probe with the at least one optical calibration structure; and
 collecting data utilizing the at least one optical probe and utilizing the at least one optical calibration structure.

7. The optical probe system of claim 1, wherein the horizontal viewing structure is a first horizontal viewing structure, wherein the horizontally viewed region is a first horizontally viewed region, wherein the horizontal viewing direction is a first horizontal viewing direction, and further wherein the at least one optical calibration structure includes a second horizontal viewing structure configured to facilitate viewing of a second horizontally viewed region from a second horizontal viewing direction that is parallel, or at least substantially parallel, to the calibration chuck support surface.

8. The optical probe system of claim 7, wherein the second horizontal viewing direction is at least substantially perpendicular to the first horizontal viewing direction.

9. The optical probe system of claim 1, wherein the calibration chuck includes a calibration substrate, and further wherein the horizontally viewed region includes a calibration substrate edge of the calibration substrate.

10. The optical probe system of claim 9, wherein the calibration substrate edge defines a transition between a horizontal calibration substrate surface of the calibration substrate, which is at least substantially parallel to the calibration chuck support surface, and a vertical calibration substrate surface of the calibration substrate, which is at least substantially perpendicular to the calibration chuck support surface.

11. The optical probe system of claim 10, wherein the calibration substrate includes a notched region configured to facilitate alignment of an optical probe of the optical probe system proximate the calibration substrate edge and also to facilitate alignment of a distance sensor of the optical probe system vertically above the horizontal calibration substrate surface.

12. The optical probe system of claim 1, wherein the horizontal viewing structure includes a horizontal illumination assembly configured to illuminate the horizontally viewed region with a horizontal light beam that is directed at least partially along the horizontal viewing direction.

13. The optical probe system of claim 12, wherein the horizontal illumination assembly is configured to back-illuminate the horizontally viewed region.

14. The optical probe system of claim 12, wherein the horizontal illumination assembly includes a horizontal illumination assembly light source configured to generate an illumination light beam.

15. The optical probe system of claim 14, wherein the horizontal illumination assembly includes a horizontal illumination assembly reflective surface configured to reflect the illumination light beam to back-illuminate the horizontally viewed region.

16. The optical probe system of claim 15, wherein the horizontal illumination assembly includes a horizontal illumination assembly adjustment mechanism configured to selectively adjust an orientation of the horizontal illumination assembly reflective surface.

17. The optical probe system of claim 1, wherein the at least one optical calibration structure includes a vertical viewing structure configured to facilitate viewing of a vertically viewed region from a vertical viewing direction that is at least substantially perpendicular to the calibration chuck support surface via the imaging device of the optical probe system that is positioned vertically above the calibration chuck support surface.

18. The optical probe system of claim 17, wherein the vertical viewing structure is configured to utilize at least one reflection to facilitate viewing of the vertically viewed region.

19. The optical probe system of claim 17, wherein the vertical viewing structure includes at least one of:
 (i) a prism;
 (ii) a right angle prism; and
 (iii) a gradient index lens with fiber assembly.

20. The optical probe system of claim 17, wherein the vertical viewing structure is embedded at least partially within the calibration chuck body.

21. The optical probe system of claim 17, wherein the vertical viewing structure includes at least one optically reflective surface.

22. The optical probe system of claim 1, wherein the at least one optical calibration structure includes a calibration chuck light detector configured to detect light that is incident thereupon.

23. The optical probe system of claim 22, wherein the calibration chuck light detector is configured to detect the light from a detection direction that is at least substantially parallel to a vertical viewing direction of the imaging device.

24. The optical probe system of claim 22, wherein the calibration chuck light detector includes at least one of a calibration chuck photo detector, a calibration chuck photo diode, and an optical power meter.

25. The optical probe system of claim 22, wherein the calibration chuck further includes an obstructive calibration structure that is associated with the calibration chuck light detector, and wherein the obstructive calibration structure is configured to selectively obstruct a portion of an optical signal that is directed toward the calibration chuck light detector.

26. The optical probe system of claim 25, wherein the obstructive calibration structure includes at least one of a knife edge calibration structure and a pinhole calibration structure.

27. A calibration chuck for an optical probe system, the calibration chuck comprising:
  a calibration chuck body that defines a calibration chuck support surface; and
  at least one optical calibration structure supported by the calibration chuck body, wherein the at least one optical calibration structure includes a horizontal viewing structure configured to facilitate viewing of a horizontally viewed region from a horizontal viewing direction that is at least substantially parallel to the calibration chuck support surface via an imaging device of the optical probe system that is positioned vertically above the calibration chuck support surface;
  wherein the calibration chuck includes a calibration substrate;
  wherein the horizontally viewed region includes a calibration substrate edge of the calibration substrate;
  wherein the calibration substrate edge defines a transition between a horizontal calibration substrate surface of the calibration substrate, which is at least substantially parallel to the calibration chuck support surface, and a vertical calibration substrate surface of the calibration substrate, which is at least substantially perpendicular to the calibration chuck support surface; and
  wherein the calibration substrate includes a notched region configured to facilitate alignment of an optical probe of the optical probe system proximate the calibration substrate edge and also to facilitate alignment of a distance sensor of the optical probe system vertically above the horizontal calibration substrate surface.

28. A calibration chuck for an optical probe system, the calibration chuck comprising:
  a calibration chuck body that defines a calibration chuck support surface; and
  at least one optical calibration structure supported by the calibration chuck body, wherein the at least one optical calibration structure includes a horizontal viewing structure configured to facilitate viewing of a horizontally viewed region from a horizontal viewing direction that is at least substantially parallel to the calibration chuck support surface via an imaging device of the optical probe system that is positioned vertically above the calibration chuck support surface;
  wherein the at least one optical calibration structure includes a probe alignment structure configured to facilitate relative alignment between at least two optical probes of the optical probe system.

29. A calibration chuck for an optical probe system, the calibration chuck comprising:
  a calibration chuck body that defines a calibration chuck support surface; and
  at least one optical calibration structure supported by the calibration chuck body, wherein the at least one optical calibration structure includes a horizontal viewing structure configured to facilitate viewing of a horizontally viewed region from a horizontal viewing direction that is at least substantially parallel to the calibration chuck support surface via an imaging device of the optical probe system that is positioned vertically above the calibration chuck support surface;
  wherein the at least one optical calibration structure includes a calibration chuck light detector configured to detect light that is incident thereupon; and
  wherein the calibration chuck light detector is configured to detect the light from a detection direction that is at least substantially parallel to a vertical viewing direction of the imaging device.

30. A calibration chuck for an optical probe system, the calibration chuck comprising:
  a calibration chuck body that defines a calibration chuck support surface; and
  at least one optical calibration structure supported by the calibration chuck body, wherein the at least one optical calibration structure includes a horizontal viewing structure configured to facilitate viewing of a horizontally viewed region from a horizontal viewing direction that is at least substantially parallel to the calibration chuck support surface via an imaging device of the optical probe system that is positioned vertically above the calibration chuck support surface;
  wherein the at least one optical calibration structure includes a vertical viewing structure configured to facilitate viewing of a vertically viewed region from a vertical viewing direction that is at least substantially perpendicular to the calibration chuck support surface via the imaging device of the optical probe system that is positioned vertically above the calibration chuck support surface.

31. The calibration chuck of claim 30, wherein the vertical viewing structure is configured to utilize at least one reflection to facilitate viewing of the vertically viewed region.

32. The calibration chuck of claim 30, wherein the vertical viewing structure includes at least one of:
  (i) a prism;
  (ii) a right angle prism; and
  (iii) a gradient index lens with fiber assembly.

33. The calibration chuck of claim 30, wherein the vertical viewing structure is embedded at least partially within the calibration chuck body.

34. The calibration chuck of claim 30, wherein the vertical viewing structure includes at least one optically reflective surface.

* * * * *